US010641824B2

(12) United States Patent
He et al.

(10) Patent No.: US 10,641,824 B2
(45) Date of Patent: May 5, 2020

(54) ELECTRICALLY CONDUCTIVE METAL FILM FOR A SEMICONDUCTOR DEVICE

(71) Applicant: EMCORE Corporation, Alhambra, CA (US)

(72) Inventors: Xiaoguang He, Diamond Bar, CA (US); Ruby Zendejaz, West Covina, CA (US); Dustin Huynh, West Convina, CA (US)

(73) Assignee: Emcore Corporation, Alhambra, CA (US)

( * ) Notice: Subject to any disclaimer, the term of this patent is extended or adjusted under 35 U.S.C. 154(b) by 280 days.

(21) Appl. No.: 15/829,859

(22) Filed: Dec. 1, 2017

(65) Prior Publication Data
US 2019/0154756 A1 May 23, 2019

Related U.S. Application Data

(60) Provisional application No. 62/588,359, filed on Nov. 19, 2017.

(51) Int. Cl.
*G01R 31/00* (2006.01)
*H01L 21/44* (2006.01)
(Continued)

(52) U.S. Cl.
CPC ............ *G01R 31/311* (2013.01); *G02B 6/122* (2013.01); *G02F 1/011* (2013.01); *H01S 5/04254* (2019.08); *H01S 5/22* (2013.01)

(58) Field of Classification Search
CPC .... G01R 31/308; G01R 31/311; G02B 6/122; G02B 6/132; G02B 6/136; H01S 5/22;
(Continued)

(56) References Cited

U.S. PATENT DOCUMENTS

| 4,622,574 | A | | 11/1986 | Garcia |
| 5,683,937 | A | * | 11/1997 | Furukawa ............. H01S 5/0425 438/42 |
| 9,059,801 | B1 | * | 6/2015 | Blauvelt ................. H01S 5/026 |

OTHER PUBLICATIONS

Ichikawa et al; Failure Analysis of InP-Based Edge-Emitting Buried Heterostructure Laser Diodes Degraded by Forward-Biased Electrostatic Discharge Tests; 2009 Jpn. J. Appl. Phys. vol. 48 052102.

* cited by examiner

*Primary Examiner* — Minh N Tang
(74) *Attorney, Agent, or Firm* — David S. Alavi

(57) ABSTRACT

A semiconductor device comprises a device substrate and a metal film, with first and second non-recessed areal regions separated by a recessed areal region. The metal film covers contiguously the recessed and non-recessed areal regions and transition surfaces joining them. A first transition surface includes metallized portions over which (i) the first transition surface is not parallel to the other transition surface, (ii) the first transition surface is inclined relative to the device substrate, and (iii) the metal film on the first transition surface is contiguous with adjacent metal film portions on the recessed and non-recessed areal regions. A portion of an optoelectronic device surface running parallel to an optical waveguide of the device can be left exposed by a metal film on the device. Light propagating transversely out of the waveguide through the exposed portion can be detected, measured, or imaged for non-destructive device characterization or testing.

28 Claims, 14 Drawing Sheets

(51) Int. Cl.
    *H01S 5/20*           (2006.01)
    *G01R 31/311*     (2006.01)
    *G02B 6/122*      (2006.01)
    *G02F 1/01*       (2006.01)
    *H01S 5/22*       (2006.01)
    *H01S 5/042*      (2006.01)

(58) Field of Classification Search
    CPC ...... H01S 5/042; H01S 5/0425; H01S 5/0265;
                  G02F 1/011; G02F 1/153; G02F 1/161
    See application file for complete search history.

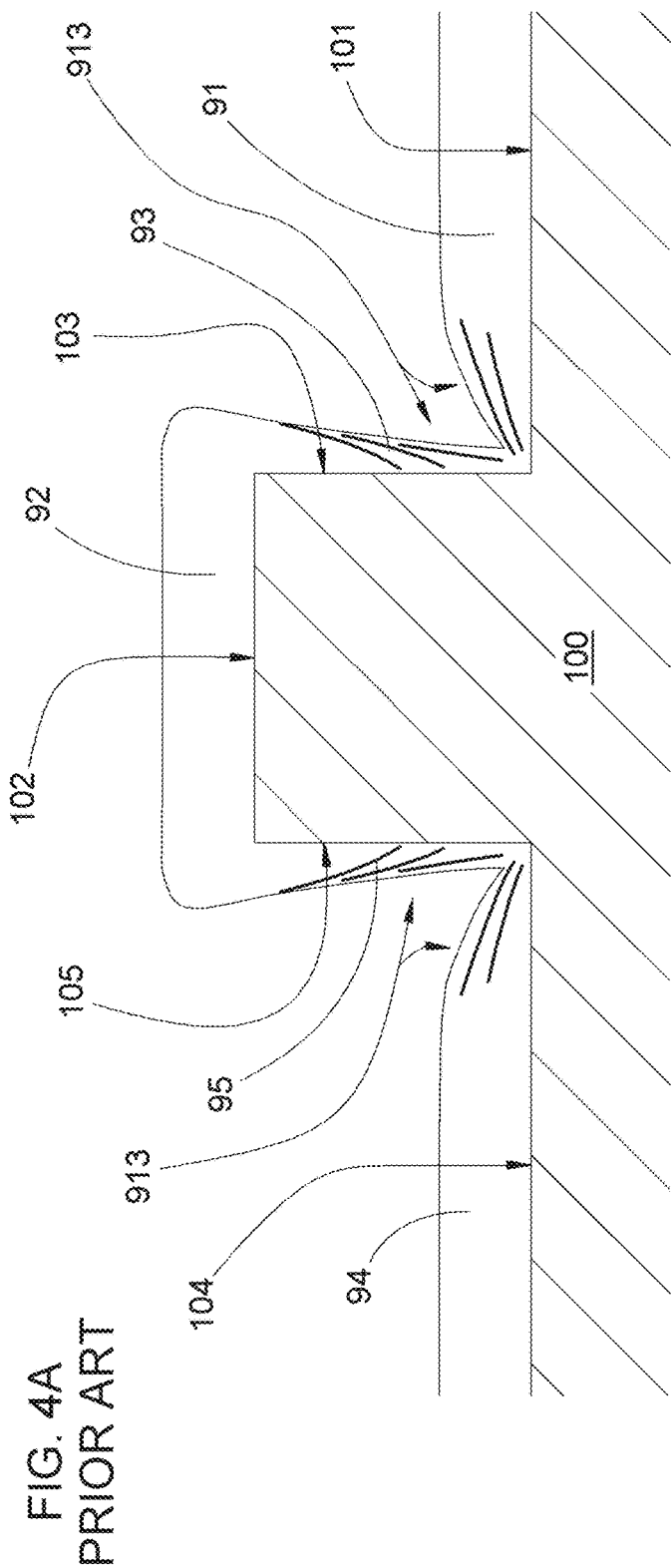
FIG. 4A
PRIOR ART
FIG. 4B
PRIOR ART

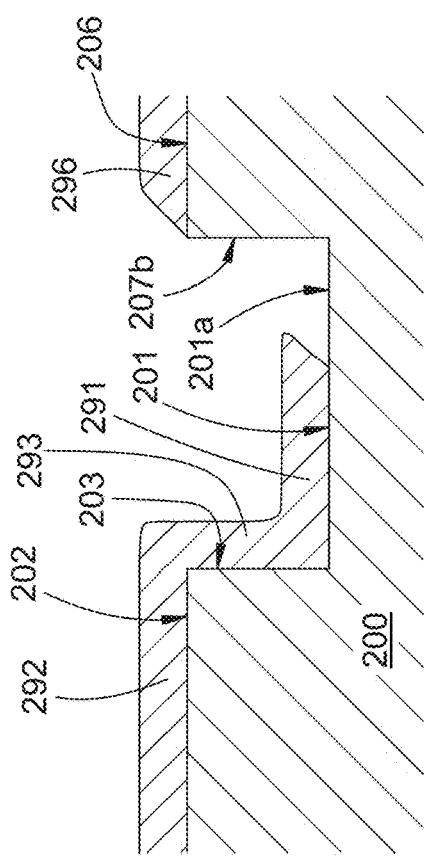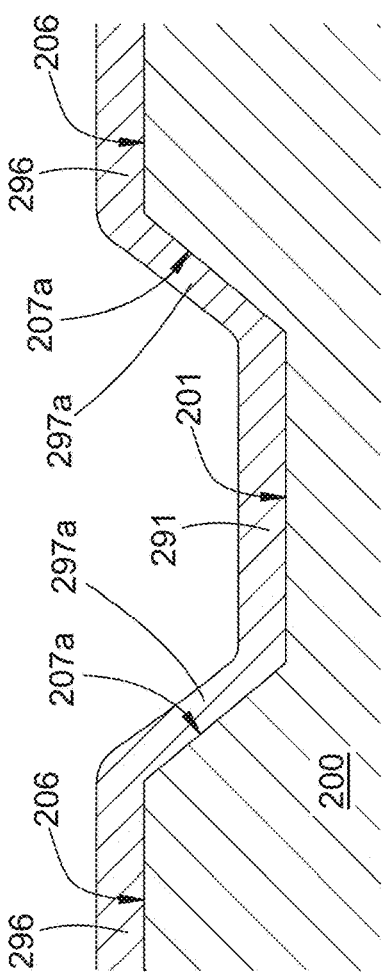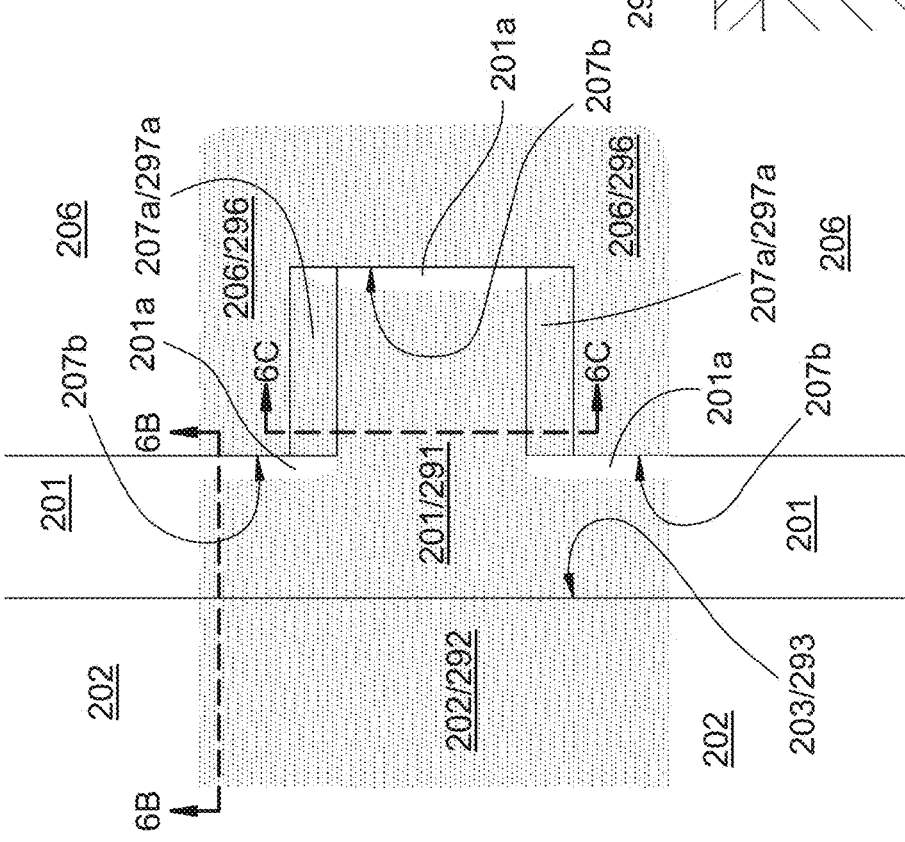
FIG. 6B
FIG. 6C
FIG. 6A

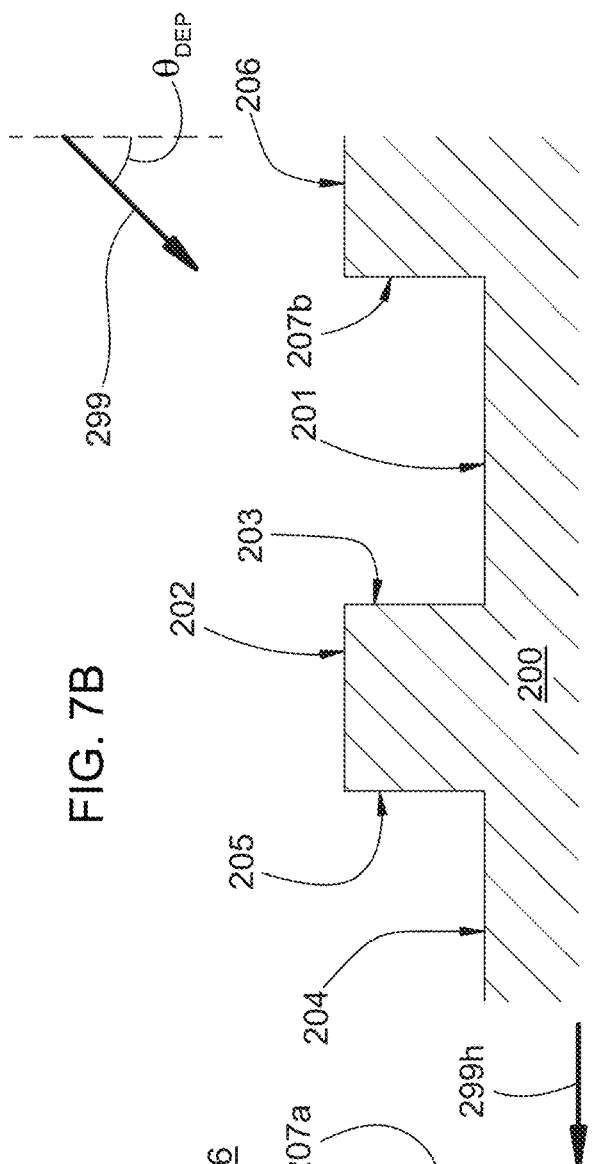
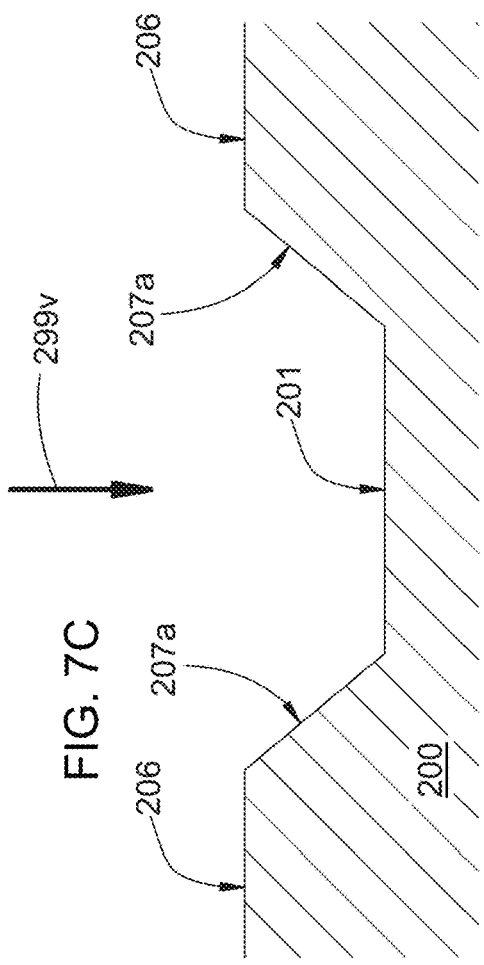
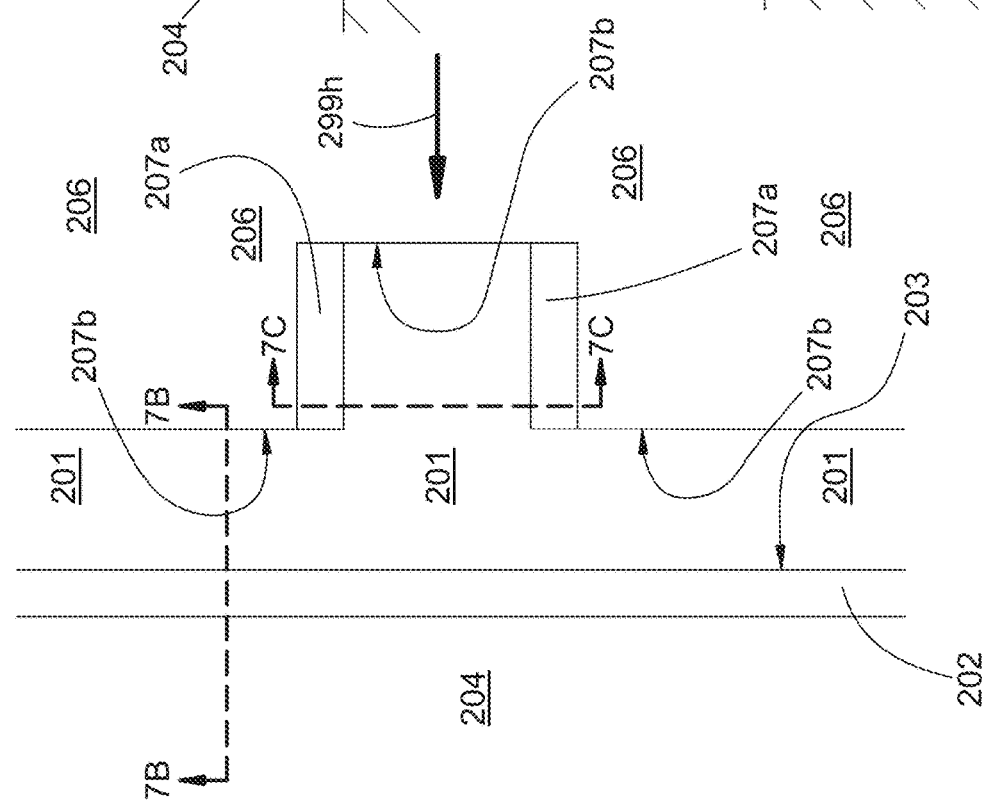
FIG. 7A
FIG. 7B
FIG. 7C

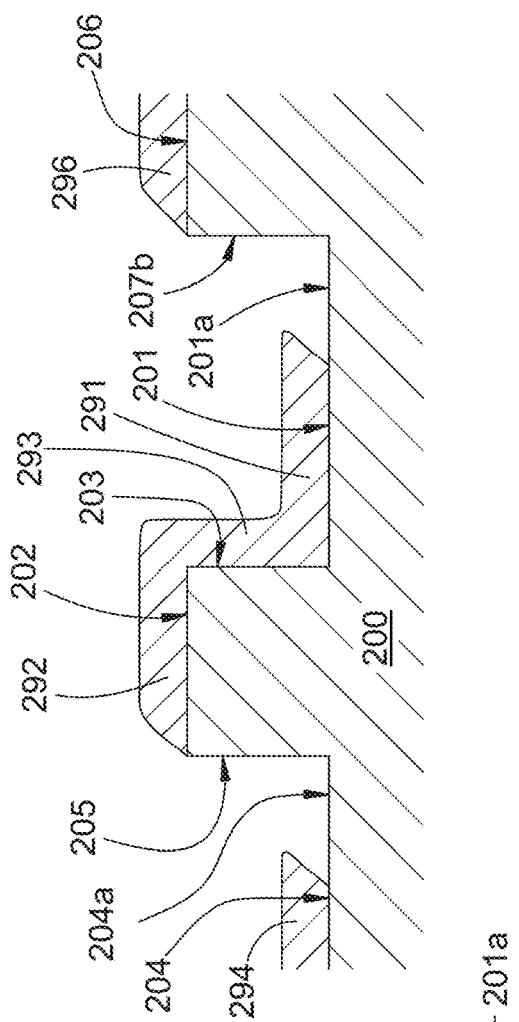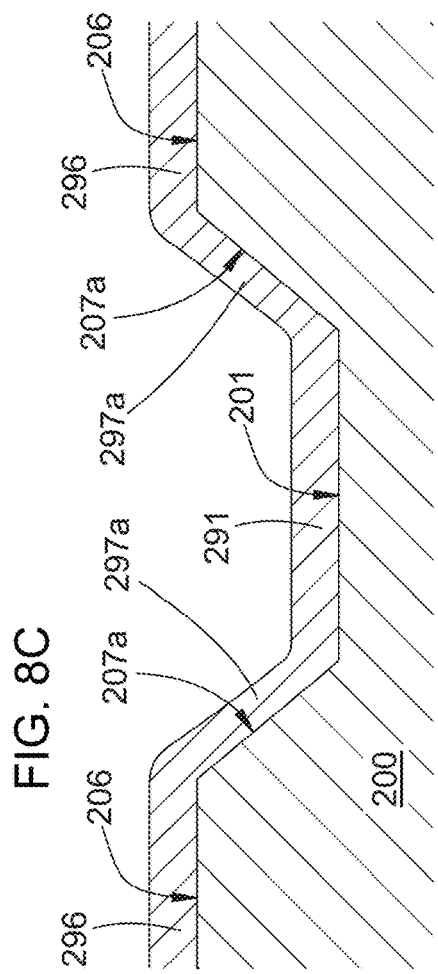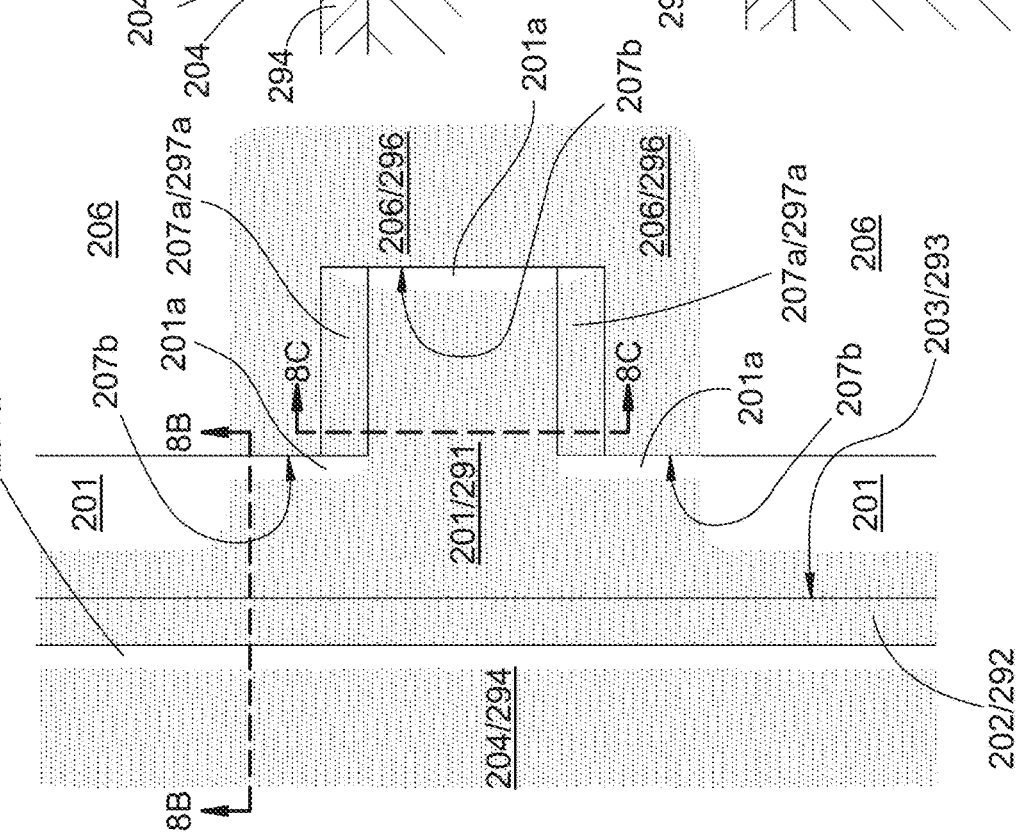
FIG. 8A
FIG. 8B
FIG. 8C

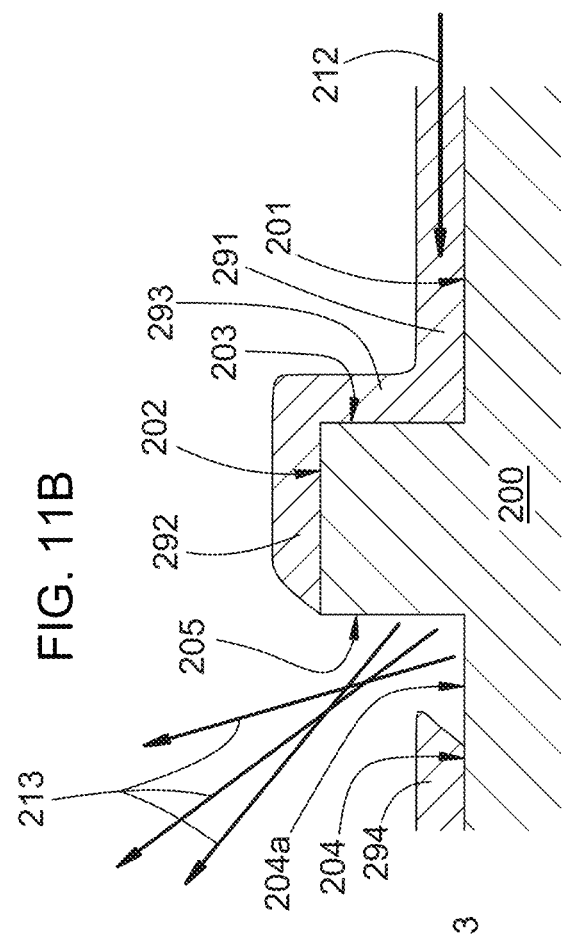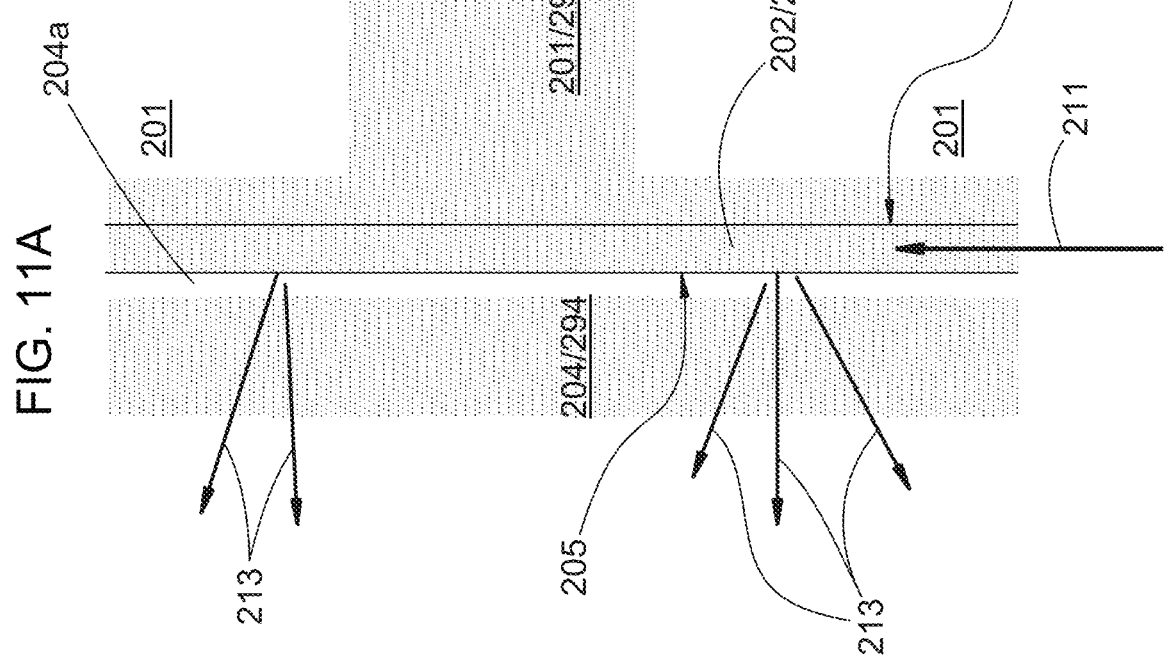

ELECTRICALLY CONDUCTIVE METAL FILM FOR A SEMICONDUCTOR DEVICE

BENEFIT CLAIMS TO RELATED APPLICATIONS

This application claims benefit of U.S. provisional App. No. 62/588,359 filed Nov. 19, 2017 in the names of Xiaoguang He, Ruby Zendejaz, and Dustin Huynh, entitled "Electrically conductive metal film for a semiconductor device"; said provisional application is hereby incorporated by reference as if fully set forth herein.

FIELD OF THE INVENTION

The field of the present invention relates to electronic and optoelectronic semiconductor devices. In particular, metal films acting as electrical conductors that span areal regions of differing heights on a semiconductor device top surface, and methods for making or using such metal films, are disclosed herein.

BACKGROUND

Metal films are used to form electrically conductive traces, electrodes, or connections on semiconductor devices, e.g., electronic or optoelectronic devices. Enlarged areas of such films can be employed as bond pads for enabling electrical connection of the semiconductor device to other electrical circuits or devices, e.g., via an electrically conductive wire attached to the bond pad or a component soldered to the bond pad. A common method for forming a metal film on a semiconductor device substrate includes: (i) spatially selective processing of a mask that leaves exposed certain areas of a top surface of the device substrate where the metal film is desired, (ii) deposition of the metal film over the substrate (both masked and unmasked areas), and (iii) removal of the mask from the substrate, along with any metal deposited on the masked areas, leaving behind the metal film deposited on the unmasked areas of the device substrate top surface. Such a process is referred to as a lift-off process. The metal typically is deposited from a vapor (e.g., by evaporation, sputtering, other physical vapor deposition, or chemical vapor deposition), and the deposition process typically exhibits at least partial directionality, in some cases nearly complete directionality. In a directional deposition process, a surface perpendicular to the deposition direction receives the thickest coating, and coating thickness decreases as the surface is tilted farther from that perpendicular orientation. With a highly directional deposition process and a surface parallel to the deposition direction, little or no metal is deposited. An undercut surface (i.e., a surface tilted beyond parallel to the deposition direction and therefore facing at least partly away from the deposition direction) typically would receive little or no metal in a directional process.

Many semiconductor devices include distinct areal regions of the top surface of the device substrate that are at differing vertical positions (i.e., at differing heights). For purposes of the present disclosure and appended claims: (i) horizontal directions are defined as being parallel the device substrate, (ii) the vertical direction is defined as being perpendicular to the device substrate, and (iii) the substrate top surface is defined as the generally horizontal substrate surface on which the electronic or optoelectronic device is formed. For purposes of the present disclosure and appended claims, the terms "device substrate," "semiconductor substrate," or "substrate" shall designate all of the materials that make up the device except for the metal film, including, e.g., one or more semiconductors or alloys thereof, or one or more oxides, nitrides, or other dielectric materials. The "substrate top surface," "device substrate top surface" or "device top surface" is the top surface of the uppermost of those materials, on selected portions of which the metal film is deposited to form the electrically conductive traces, electrodes, or connections; in some examples an additional electrical contact or electrode can also be formed on the substrate bottom surface. Recessed regions of the device substrate top surface can be formed for any suitable reason. In some examples of an electronic or optoelectronic device, a recessed trench is formed between two non-recessed regions, e.g., so as to electrically separate distinct portions of an active semiconductor layer in the device substrate. In some examples of an optoelectronic device, recessed regions are formed on either side of a non-recessed ridge, e.g., so as to provide lateral optical confinement of one or more optical modes supported by a waveguide on the device substrate. For purposes of the present disclosure and appended claims, the terms "recessed" and "non-recessed" are relative terms indicating only that one areal region (the non-recessed region) is at a height greater than the height of another, adjacent areal region (the recessed region). A recessed region is not necessarily the lowest region on the device substrate; distinct recessed regions are not necessarily at the same height; a non-recessed region is not necessarily the highest region on the device substrate; distinct non-recessed regions are not necessarily at the same height. In certain instances, a given areal region of the device substrate can be recessed relative to one adjacent areal region that is at a greater height), and non-recessed relative to a different adjacent areal region that is at a lesser height).

It is common for an electrically conductive metal film to traverse boundaries between adjacent recessed and non-recessed areal regions. To convey electrical signals or currents across the boundary, the metal film must be formed contiguously on the recessed areal region, the non-recessed areal region, and a transition surface joining them, e.g., a substantially vertical surface spanning the height difference. As noted above, common metal deposition processes are at least partially directional, so that simultaneously depositing the metal film on the adjacent, substantially horizontal areal regions and also on the vertical wall joining them can result in differing film thicknesses, and differing electrical properties such as resistance or conductivity, between the horizontal and vertical portions of the metal film. For example, if a highly directional deposition process is employed with a vertical deposition direction 99 (e.g., as in FIG. 1A, in which the vertical transition surface 103 joins the recessed region 101 and the non-recessed region 102 of the top surface of device substrate 100), there might be insufficient metal deposition on the vertical transition surface 103 to enable sufficient electrical conductivity between the metal film portions 91 and 92 on the recessed and non-recessed regions 101 and 102, respectively. One way to mitigate that problem is use of a deposition direction 99 that is not vertical (i.e., $\theta_{DEP} \neq 0°$), and so not parallel to the vertical transition surface 103, thereby enabling metal deposition on the vertical transition surface 103 as well as the horizontal recessed and non-recessed regions 101 and 102. A deposition direction about 45° from vertical (i.e., $\theta_{DEP} \approx 45°$), and with a horizontal projection roughly perpendicular to the areal boundary between regions 101 and 102, would deposit similar metal thickness on both horizontal and vertical portions of the surface (e.g., metal film portions 91/92/93 on respective surfaces 101/102/103, as in FIG. 1B). However, on a typical device there are areal boundaries, and corresponding transition surfaces, at a variety of horizontal orientations, which would receive different thicknesses of deposited metal in given tilted arrangement. A transition surface could even be left completely devoid of metal if it were shadowed by an adjacent non-recessed region.

For example, as shown in FIG. 2A, a non-recessed areal region 102 (e.g., a top surface of a protruding ridge) separates two recessed regions 101 and 104. The top surface of the ridge (i.e., the non-recessed areal region 102), one of its side surfaces that faces a non-vertical deposition direction 99 (i.e., the near-side ridge surface 103), and at least a portion of a first one of the recessed areal regions 101 (the portion adjacent to the near-side ridge surface 103) would all be coated by respective portions 92/93/91 of the metal film, as well as a portion of the second recessed region 104 displaced from the ridge. However, the other side surface of the ridge (i.e., the far-side ridge surface 105) and a portion of the second recessed region 104 (the portion adjacent to the far-side ridge surface 105) would be shadowed by the ridge, and would receive little or no deposited metal. In another example, as shown in FIG. 2B, a recessed areal region 101 (e.g., a trench) separates two non-recessed areal regions 102 and 106. Both non-recessed areal regions 102/106 and at least an upper portion of one side trench surface that faces a non-vertical deposition direction (i.e., the far-side trench surface 103) would be coated by respective portions 92/96/93 or the metal film. If the trench is not too narrow, or if the deposition direction is not too far from vertical, the entire far-side trench wall 103, and at least a portion of the trench bottom surface 101 (i.e., the portion of the recessed areal region 101 adjacent to the far-side trench surface 103) would also be coated by respective portions 93/91 of the metal film. However, the other side surface of the trench (i.e., the near-side trench surface 107) and a portion 101a of the trench bottom surface 101 adjacent to the near-side trench surface 107 would be shadowed, and would receive little or no deposited metal.

In both of those examples, electrical continuity of the metal film across the ridge or trench would be difficult, if not impossible, to achieve. One conventional approach toward mitigating that continuity problem is variation of the deposition direction during the metal deposition process. That can be achieved in a number of ways, typically by rocking the substrate back-and-forth about a horizontal axis, or by so-called planetary rotation of the substrate relative to the deposition source, during the deposition process. In both of those examples, portions of the substrate top surface that are shadowed from metal deposition at certain orientations of the substrate are not shadowed at other orientations. In the ridge or trench examples described above, rocking the substrate back-and-forth about a horizontal axis parallel to the ridge or trench would result in metal deposition on both near-side and far-side surfaces (because those descriptors switch back-and-forth as the substrate rocks), and also on corresponding portions of recessed areal regions adjacent to those side surfaces. However, there are a number of disadvantages associated with rocking or rotating the substrate during the deposition process. One problem is the additional mechanical and process complexity introduced into the deposition process, providing opportunities for misalignment, maladjustment, malfunction, or failure. Another problem is lack of uniformity of the thickness of the metal film (e.g., as in FIGS. 3A and 3B), because some areas are intermittently shadowed during the deposition process while others are not. To achieve sufficiently low resistivity or sufficiently high conductivity of the metal film in intermittently shadowed areas can result in excessive film thickness over areas that are never shadowed. Another problem is reduced quality of the deposited film on those areas that are intermittently shadowed. Voids, fractures, or other defects 913 (e.g., as in FIG. 4A and the electron micrograph of FIG. 4B) occur more frequently when the deposition process is not continuous, and those can increase resistance or decrease conductivity of the resulting film, or even lead to its failure. Perhaps more significantly, the unpredictable nature of the occurrence of such defects can lead to undesirably large variation in resistivity or conductivity of the metal film.

SUMMARY

An inventive semiconductor device comprises a device substrate and a metal film. A device substrate top surface includes first and second non-recessed areal regions separated by a recessed areal region. The metal film covers contiguously at least a portion of the first non-recessed areal region, at least a portion of the recessed areal region, at least a portion of the second non-recessed areal region, at least a portion of a first transition surface joining the recessed and first non-recessed areal regions, and at least a portion of a second transition surface joining the recessed and second non-recessed areal regions. The first transition surface includes one or more metallized portions over which (i) corresponding horizontal projections of surface-normal vectors of the first and second transition surfaces are not antiparallel, (ii) the surface-normal vector of the first transition surface is not parallel to the device substrate and is directed at a non-zero angle above the substrate top surface, and (iii) a corresponding portion of the metal film covers the first transition surface and is contiguous with adjacent portions of the metal film on the recessed and first non-recessed areal regions.

An inventive semiconductor device comprises a device substrate, an optical waveguide formed on or in the device substrate, and a metal film formed over at least a portion of a device surface. The metal film is arranged so as to apply an electrical signal to the optical waveguide, and so as to leave exposed at least a portion of the device surface running substantially parallel to the optical waveguide. Light emanating from within the optical waveguide can propagate transversely out of the optical waveguide through portions of the device surface left exposed by the metal film. An inventive method for using such an inventive device comprises (A) applying an electrical signal or current to the metal film, or propagating an optical signal along the optical waveguide; and (B) detecting, measuring, or imaging light propagating transversely out of the optical waveguide through portions of the device surface left exposed by the metal film.

Objects and advantages pertaining to metal films for semiconductor devices or to non-destructive testing of optoelectronic devices incorporating waveguides and metal films may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 3A, 3B, and 4A illustrate schematically, and FIG. 4B is an electron micrograph of, metal films formed by conventional directional metal deposition on areal regions of differing heights.

FIGS. 5A-5C and 6A-6C illustrate schematically an example of an inventive arrangement of, and for forming, a metal film on a semiconductor device.

FIGS. 7A-7C and 8A-8C illustrate schematically another example of an inventive arrangement of, and for forming, a metal film on a semiconductor device.

FIGS. 11A and 11B illustrate schematically an inventive method for non-destructive testing or characterization of an inventive optoelectronic device.

Figures 1A, 1B:
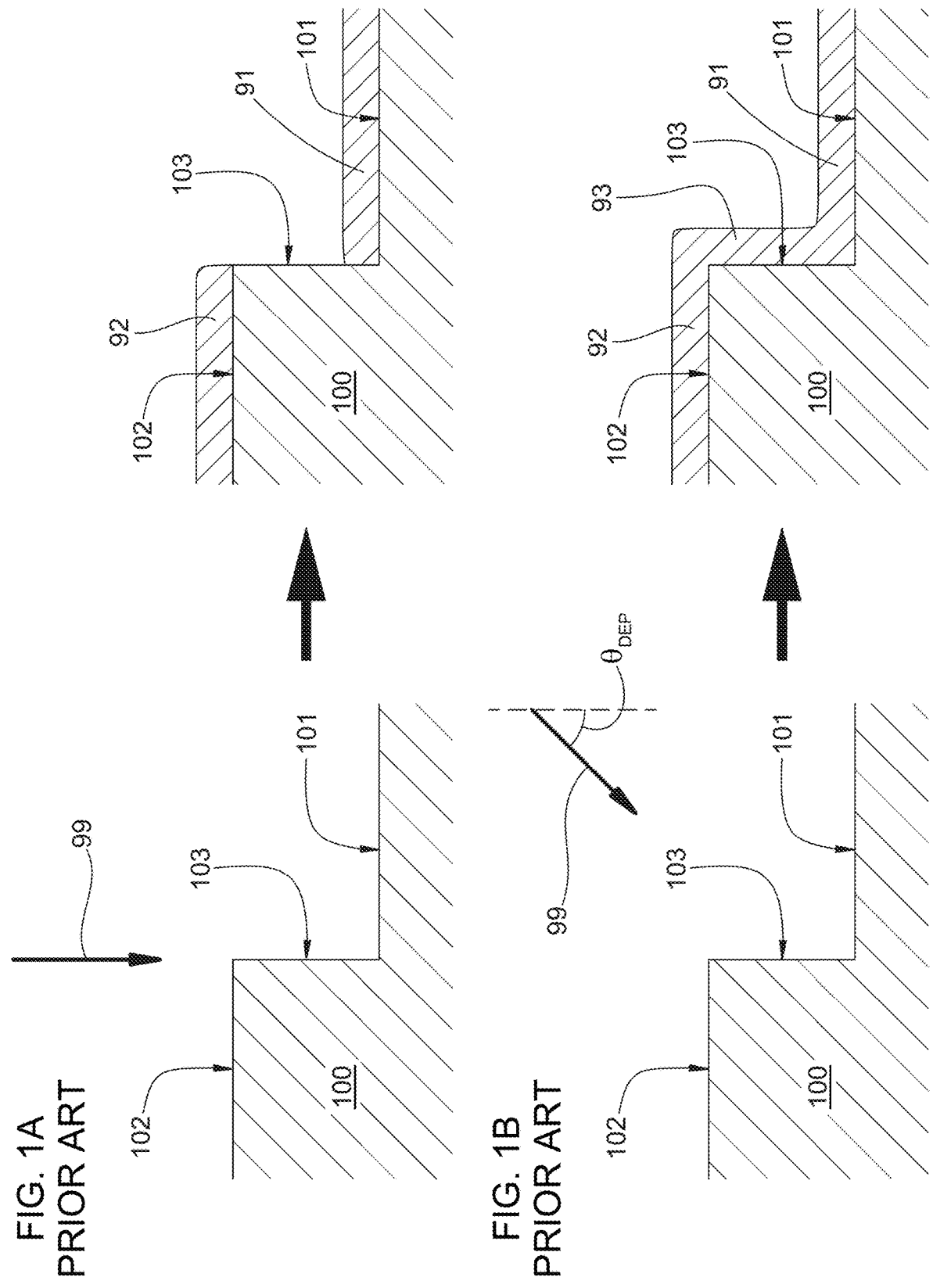
FIGS. 1A and 1B illustrate schematically conventional directional metal deposition on areal regions of differing heights.
Figure 2A:
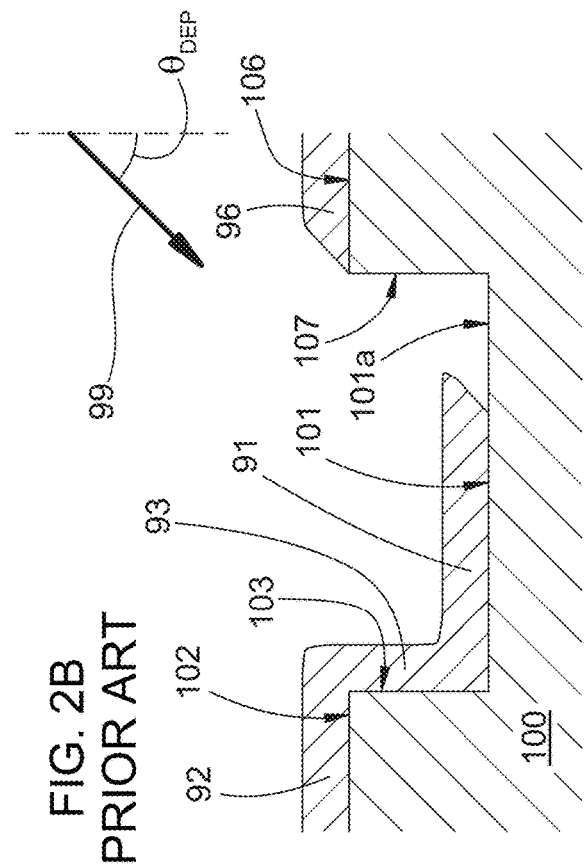
FIGS. 2A and 2B illustrate schematically metal films formed by conventional directional metal deposition on areal regions of differing heights.
Figure 2B:
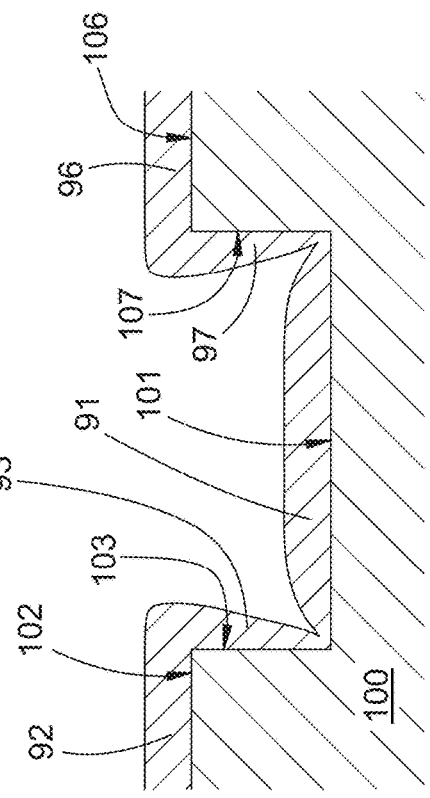
Figure 3A:
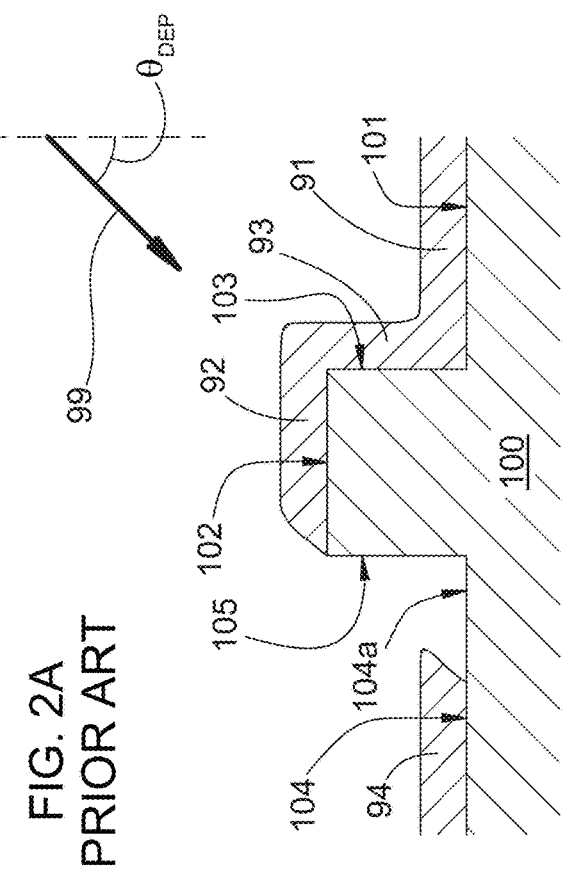
Figure 3B:
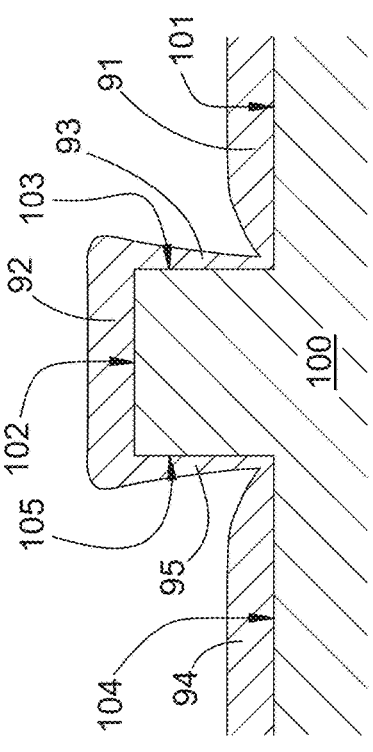

The embodiments depicted are shown only schematically; all features may not be shown in full detail or in proper proportion, certain features or structures may be exaggerated relative to others for clarity, and the drawings should not be regarded as being to scale. The embodiments shown are only examples; they should not be construed as limiting the scope of the present disclosure or appended claims.

DETAILED DESCRIPTION OF EMBODIMENTS

Various inventive arrangements of a metal film on an electronic or optoelectronic device, or for depositing the metal film on the device, are illustrated schematically in FIGS. 5A-5C, 6A-6C, 7A-7C, 8A-8C, 9A-9G, and 10A-10D. The device substrate typically comprises one or more semiconductors (e.g., silicon, doped silicon, or other one or more Group IV semiconductor materials, or one or more III-V semiconductor materials), along with whatever additional oxides, nitrides, other dielectrics, or other materials are required to form the electronic or optoelectronic device. In FIGS. 5A-5C and 6A-6C the device substrate top surface includes a recessed areal region 201 separating non-recessed regions 202 and 206 (e.g., a trench 201 separating plateaus 202 and 206), and the metal film covers contiguously at least portions of the areal regions 201/202/206 and at least portions of the transition surfaces 203 and 207a joining those adjacent areal regions. In FIGS. 7A-7C and 8A-8C the device substrate top surface includes recessed areal regions 201 and 204 and non-recessed areal regions 202 and 206 (e.g., a trench 201 separating a ridge top surface 202 from a plateau 206, and the ridge separating the trench 201 from the recessed region 204). The non-recessed region 202 is the top surface of a protruding ridge separating the recessed regions 201 and 204, and in some examples can define an optical waveguide on the device substrate. In such examples, the side surfaces 203 and 205 of the ridge can provide, e.g., lateral optical confinement for optical modes supported by the optical waveguide defined by the ridge. The metal film covers contiguously at least portions of the areal regions 201/202/206 and at least portions of the transition surfaces 203 and 207a joining those adjacent areal regions, and can in some examples also cover at least a portion of the region 204.

A transition surface can assume one or more arrangements. In some examples, as noted above, a vertical surface (i.e., substantially perpendicular to the device substrate, with a surface-normal vector substantially parallel to the substrate) joins adjacent areal regions of differing heights. In the examples shown, transition surfaces 203 (joining regions 201 and 202) and 205 (joining regions 202 and 204) are arranged substantially vertically, as are portions 207b of the transition surface joining regions 201 and 206. In some examples wherein the device substrate comprises a Group IV semiconductor or a III-V semiconductor, the substantially vertical transition surfaces 203/205/207b can be substantially parallel to a {001} crystallographic surface of the device substrate. In some examples, an inclined surface (i.e., with a surface-normal vector directed upward from the device substrate top surface) can join portions of adjacent areal regions. In the examples shown, portions 207a of the transition surface joining regions 201 and 206 are in an inclined arrangement. In some examples, e.g., wherein the device substrate comprises a Group IV semiconductor or a III-V semiconductor, the inclined portions 207a of the transition surface joining regions 201 and 206 can be substantially parallel to a {111} crystallographic surface of the device substrate, with corresponding surface-normal vectors directed at an angle of about 35.3° above the device substrate. In some examples, an inverted or undercut surface (i.e., with a surface-normal vector directed downward from the substrate top surface) joins the adjacent areal regions. In some examples, a transition surface joining adjacent areal regions can include portions that vary among two or more of those arrangements (i.e., some portions vertical, some portions inclined, or some portions inverted). The various portions 207a and 207b of the transition surface joining regions 201 and 206 are thus arranged.

Note that for purposes of the present disclosure and appended claims, a surface-normal vector is defined as pointing out of the device top surface and into whatever ambient medium surrounds the device (e.g., vacuum, air, inert gas, or other medium). For example, parallel, vertical, opposing side walls of a straight trench of uniform width would be characterized by respective surface-normal vectors that are antiparallel to each other (i.e., that form an angle of about 180°). In another example, non-parallel, vertical, opposing side walls of a trench would be characterized by respective surface-normal vectors that form an angle between 90° and 180° (although as the angle approaches 90° it would make less sense to refer to the recessed region as a trench). The deposition direction vector 299 is defined as pointing toward the device top surface from above and characterized by a deposition angle $\theta_{DEP}$ (i.e., the angular deviation from a vertical deposition direction). In various drawings, horizontal or vertical projections 299h and 299v, respectively, are shown for the deposition direction vector 299. The areal regions 201/202/204/206 and the transitions surfaces 203/205/207a/207b can each be formed by any one or more suitable spatially selective material processing techniques, including, e.g., dry or wet etching. Similarly, any suitable spatially selective technique can be employed for forming the metal film, including, e.g., a masked deposition and lift-off process.

Figure 5B:
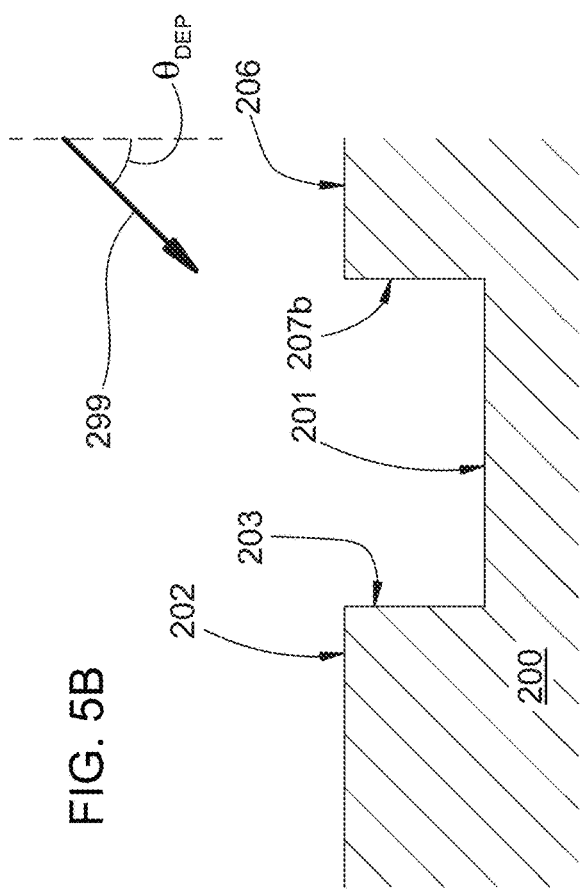
Figure 5C:
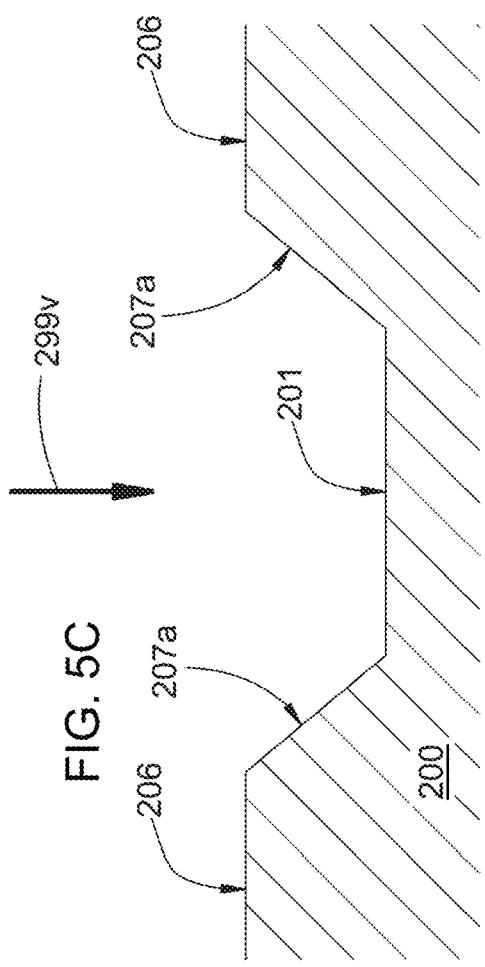
Figure 5A:
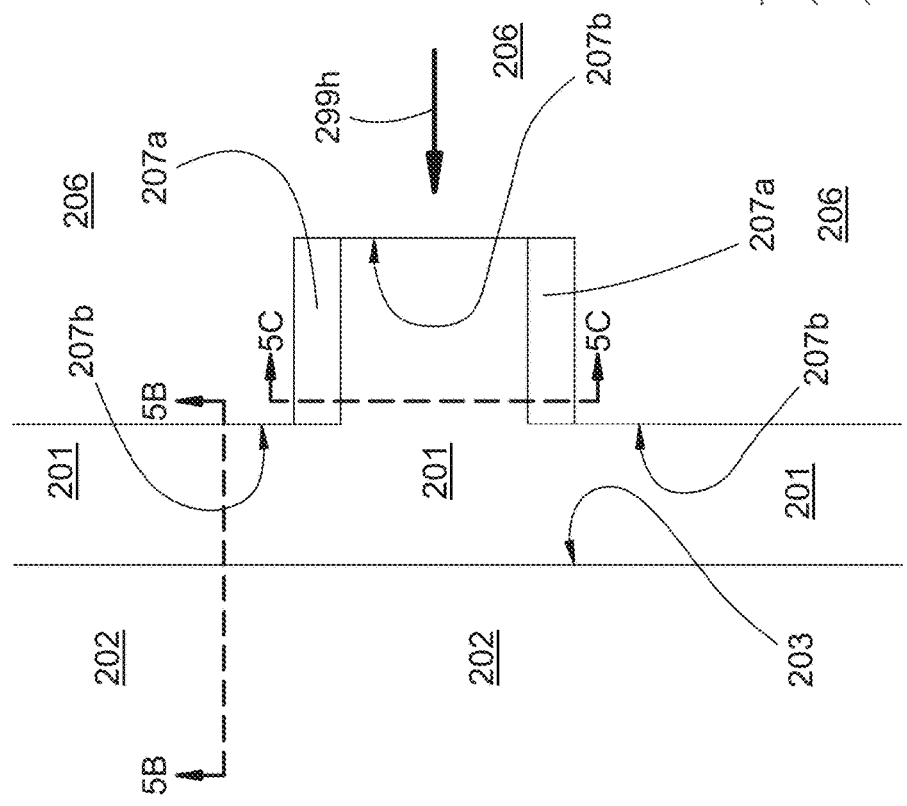
Figure 9A:
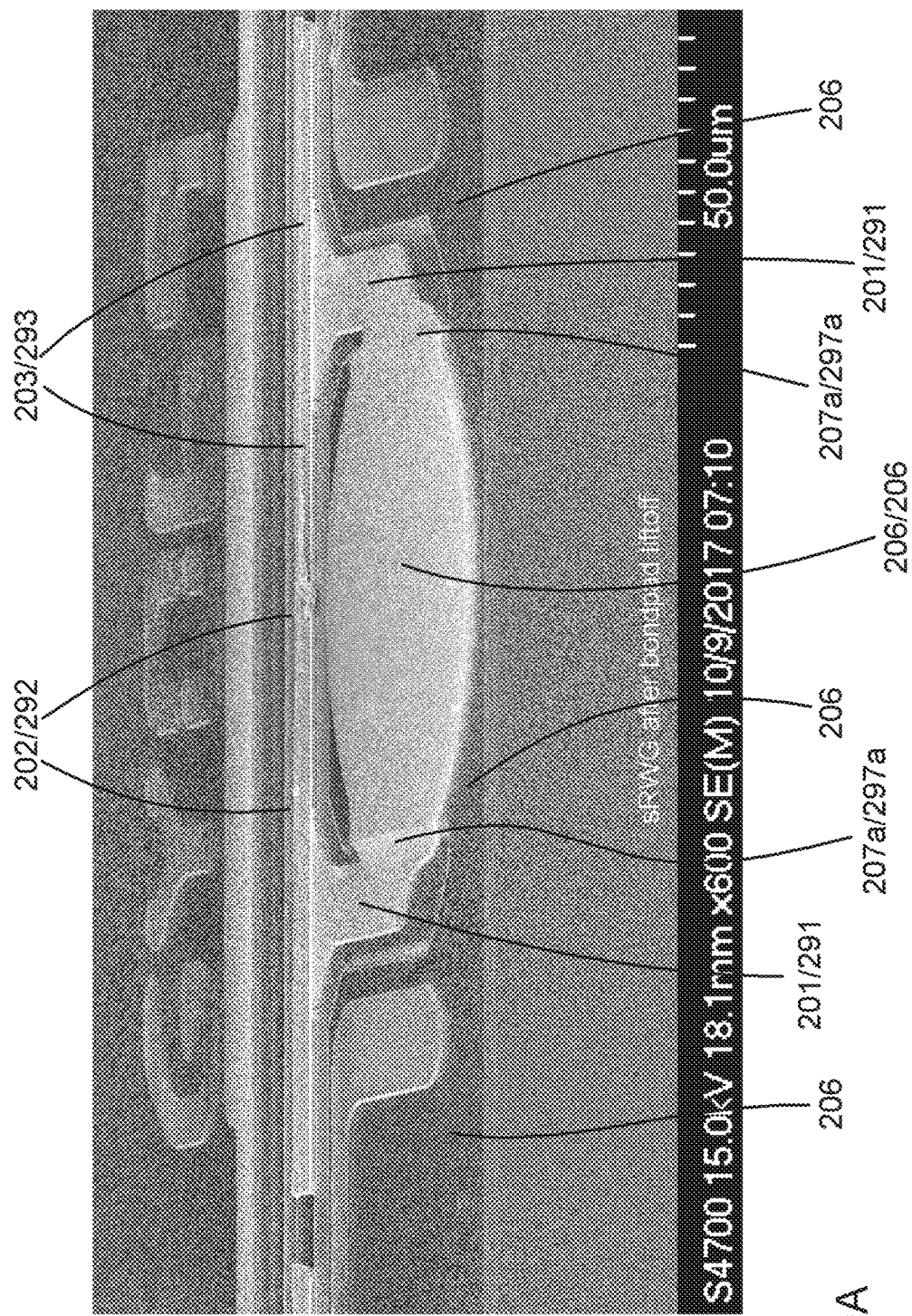
FIGS. 9A-9G are electron micrographs of an example of an inventive arrangement of a metal film on a semiconductor device.
Figures 9B, 9C:
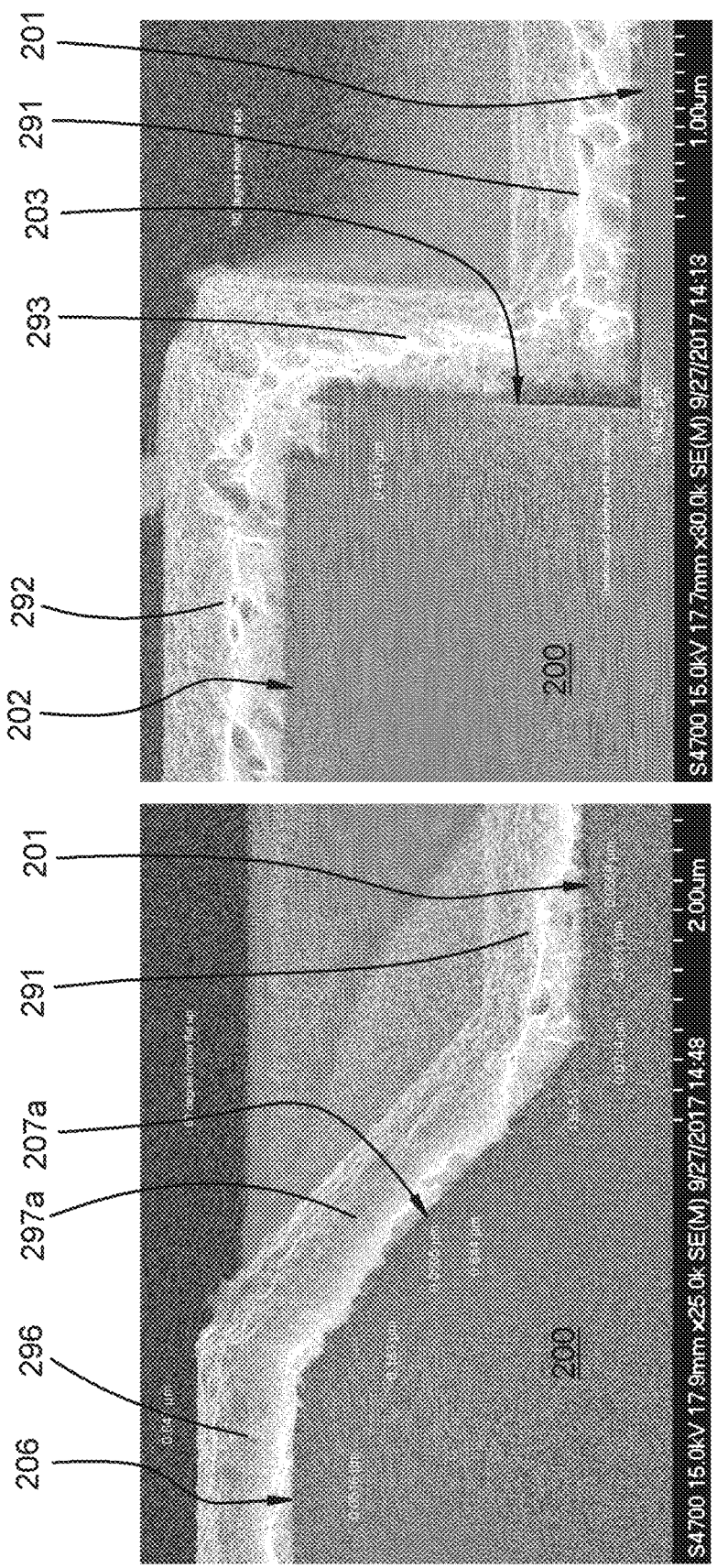
Figure 9E:
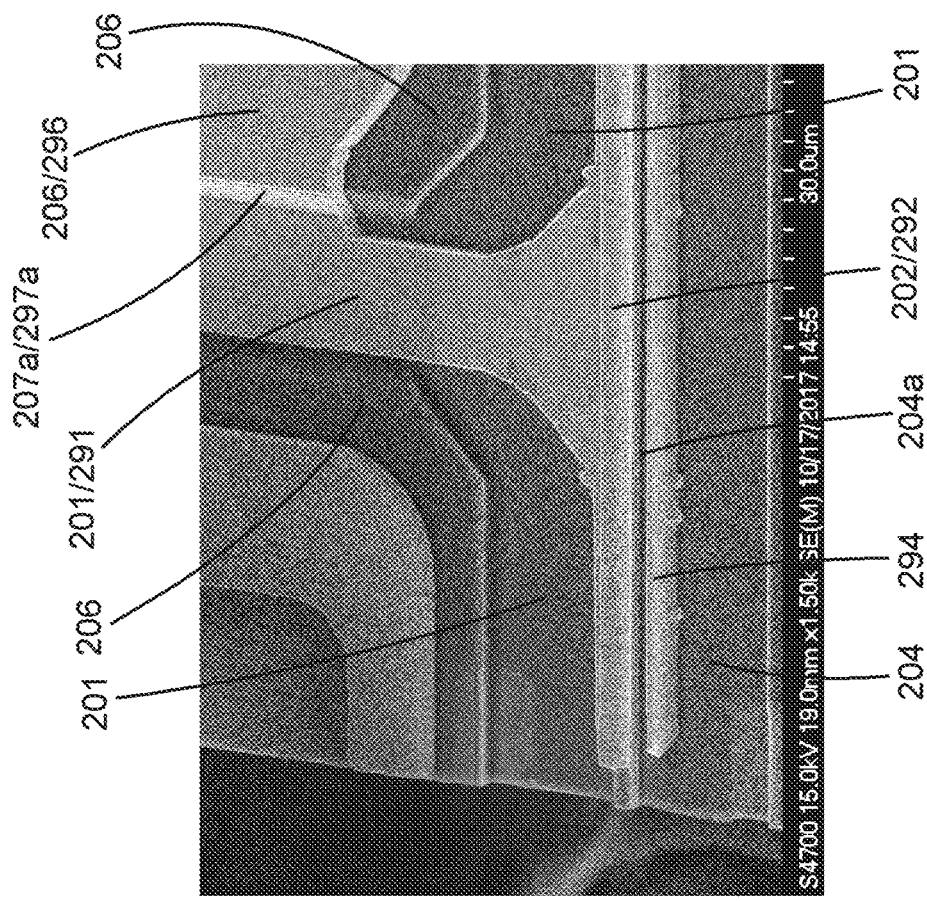
Figure 9D:
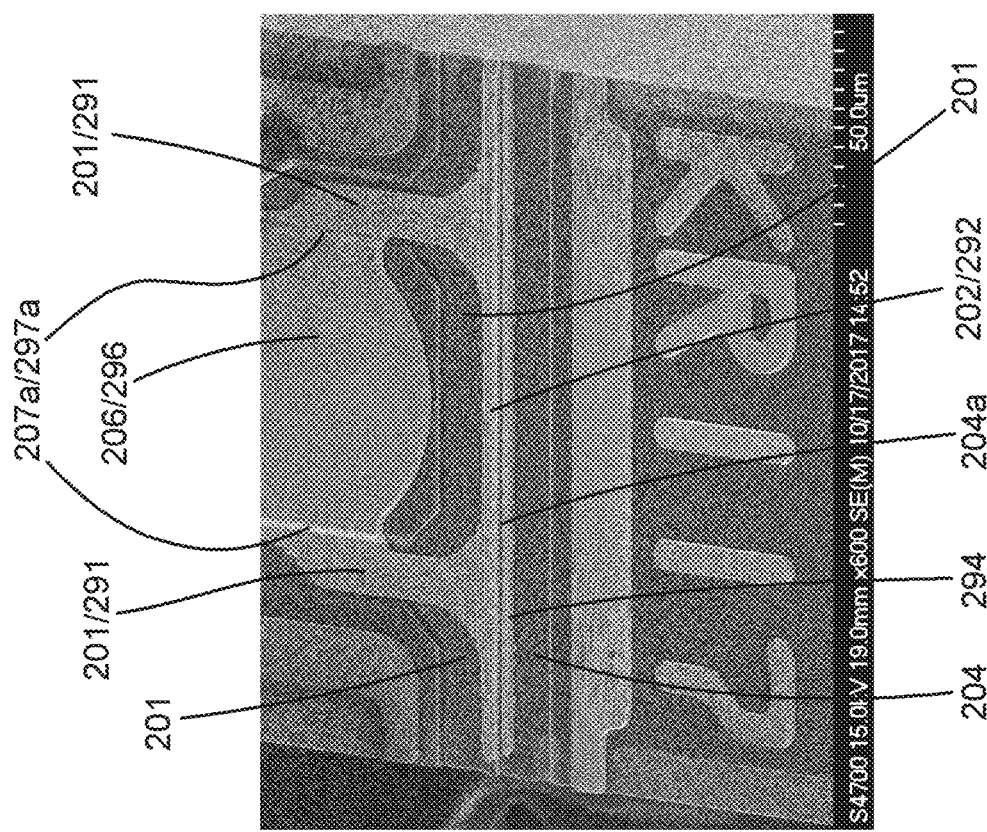
Figure 9G:
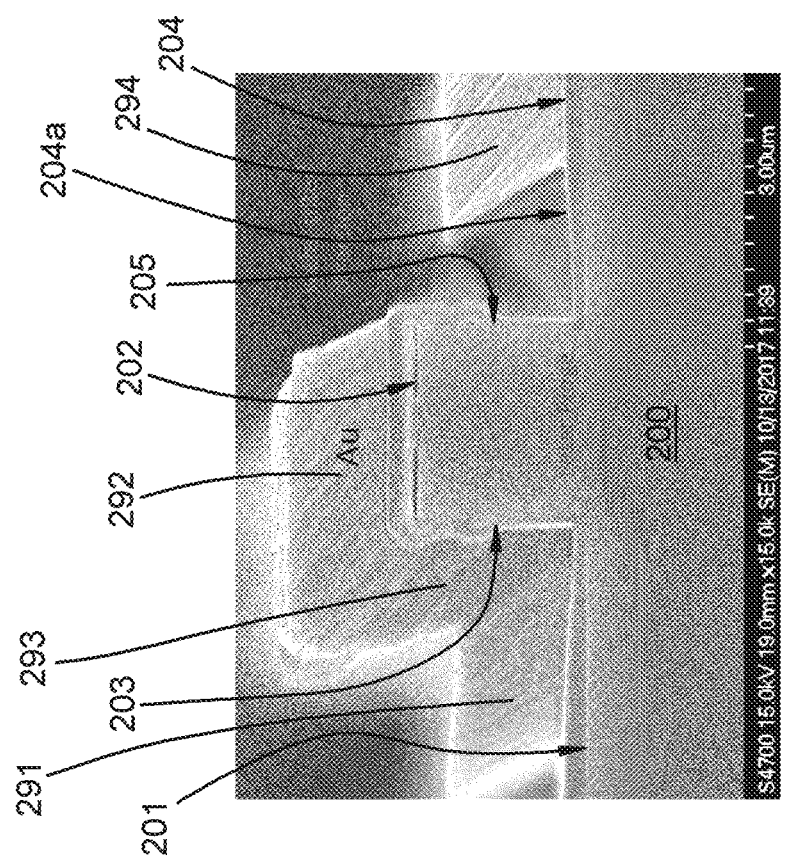
Figure 9F:
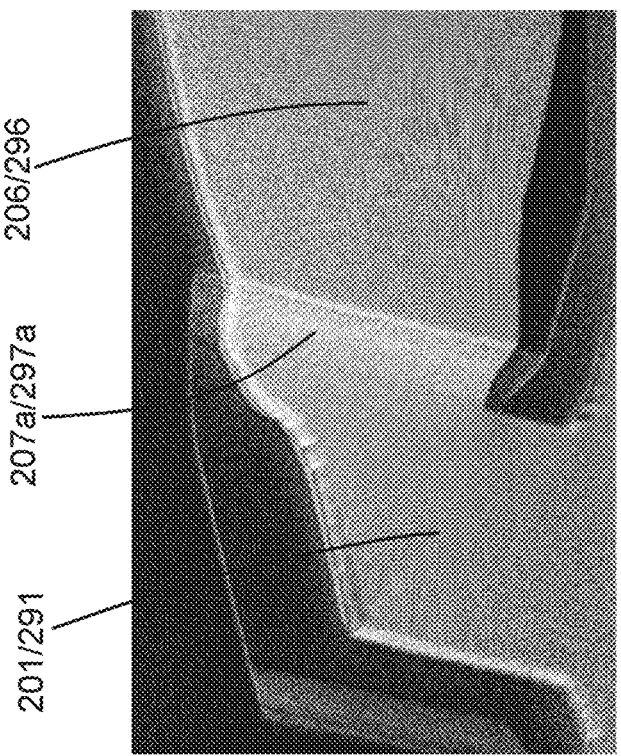

In the example of FIGS. 5A-5C (before masking and metal deposition) and FIGS. 6A-6C (after metal deposition and mask lift-off), the device top surface includes two non-recessed areal regions 202 and 206 that are separated by a recessed areal region 201 (arranged in the example shown as a main trench and a side trench; other arrangements can be employed). A metal film covers contiguously at least a portion of the non-recessed areal region 202 and 206, at least a portion of the recessed areal region 201, at least a portion of the transition surface 203 joining the regions 201 and 202, and at least a portion of the second transition surface joining the regions 201 and 206. The transition surface joining the regions 201 and 206 includes portions 207a and 207b. The transition surface portions 207a (e.g., the side walls of the side trench in the example shown) are arranged with corresponding surface-normal vectors that are not parallel to the device substrate and are directed at a non-zero angle above the substrate top surface, i.e., the transition surface portions 207a are in an inclined arrangement. In various examples, those surface-normal vectors can be directed at an angle above the substrate top surface between about 15° and about 75°, including angles within that range that are greater than about 20°, greater than about 30°, greater than about 45°, greater than about 60°, greater than about 70°, less than about 20°, less than about 30°, less than about 45°, less than about 60°, or less than about 70°. In one specific example arrangement, the transition surface portions 207a are parallel to {111} crystallographic surfaces of a Group IV or III-V semiconductor, with surface-normal vectors directed at an angle about 35.3° above the substrate top surface; such surfaces can be readily formed by certain wet etch processes, as is well known. More generally, any suitable material processing can be employed to form the transition surface portions 207a at the desired angle of inclination above the substrate top surface.

The transition surface portions 207a are also arranged so that horizontal projections of the corresponding surface-normal vectors are not antiparallel to a surface-normal vector of the transition surface 203, but instead form angles less than 180°. In many examples, including those shown in the figures, the transition surface 203 is substantially straight and substantially vertical, and therefore can be characterized by a single surface-normal vector that is substantially parallel to the device substrate 200 (e.g., the surface 203 can be substantially parallel to a {001} crystallographic surface of a III-V or Group IV semiconductor device substrate). In other examples, the surface-normal vector of the transition surface 203 can be non-parallel with respect to the device substrate 200, or can vary among different portions of the transition surface 203. In various examples, the corresponding horizontal projections of the respective surface-normal vectors of the transition surface 203 and the transition surface portions 207a form angles between about 10° and about 170°, including angles within that range that are less than about 150°, less than about 135°, less than about 120°, less than about 90°, about equal to 90°, less than about 60°, less than about 45°, less than about 30°, greater than about 150°, greater than about 135°, greater than about 120°, greater than about 90°, greater than about 60°, greater than about 45°, or greater than about 30°. In the examples shown, those horizontal projections are substantially perpendicular. Stated somewhat less precisely, the region border between the regions 201 and 206 includes portions that are not parallel to the region border between regions 201 and 202; in the examples shown, the region border between regions 201 and 206 includes portions that are substantially perpendicular to the region border between regions 201 and 202 (e.g., because the side trench is substantially perpendicular to the main trench) and are spanned by the transition surface portions 207a. Note that in some examples the region border between the regions 201 and 206 can also include (but need not include) portions that are parallel to the region border between regions 201 and 202 (i.e., antiparallel horizontal projections of the corresponding surface-normal vectors). For example, in the examples shown the transition surface portions 207b lie along such parallel region border portions (e.g., because some of them form portions of the wall of the main trench).

As illustrated schematically in FIGS. 6A-6C, the metal film covers contiguously at least a portion of the non-recessed areal region 202 (with the corresponding metal film portion 292), at least a portion of the recessed areal region 201 (with the corresponding metal film portion 291), and at least a portion of the non-recessed areal region 206 (with the corresponding metal film portion 296). A portion 293 of the metal film covers at least a portion of the transition surface 203, and is contiguous with adjacent portions 291 and 292 of the metal film. Portions 297a of the metal film cover at least portions of the transition surface portions 207a, and are contiguous with adjacent portions 291 and 296 of the metal film. In some examples, for a directional deposition process, the transition surface portions 207b and adjacent portions 201a of the recessed areal region 201 can be left without any deposited metal because they are shadowed by the non-recessed areal region 206.

It is the orientations of the transition surface portions 207a that facilitate simultaneous formation of all the metal film portions 291/292/293/296/297a without requiring rocking or rotation of the device substrate during deposition of the metal film. Note that such rocking or rotation of the substrate can still be employed, if needed or desired. With the deposition direction 299 oriented as shown (e.g., non-perpendicular with respect to the device substrate 200, with the horizontal projection 299h about antiparallel to a horizontal projection of the surface-normal vector of transition surface 203, so as to simultaneously deposit metal on surfaces 201/202/203), the orientations of the transition surface portions 207a enable them to have metal deposited at the same time. In the conventional arrangements, the transition surface joining the regions 201 and 206 would be shadowed and not coated (as is the case for the transition surface portions 207b and adjacent surface portions 201a in the inventive examples), which necessitates the rocking or rotating scheme. In the inventive arrangement, the metal film portions 291/292/293/296/297a can be formed simultaneously, if desired without substrate rocking or rotating, with corresponding thicknesses that all remain within an acceptable range of one another, and without the localized thickness variations or film defects that can occur with conventional metal deposition processes (as described above). A suitable deposition direction that can be employed has a corresponding horizontal projection 299h that forms an angle greater than about 90° with the horizontal projection of the surface-normal vector of transition surface 203, so as to result in sufficient deposition on the transition surface 203. Suitable angles include angles greater than about 90°, greater than about 120°, greater than about 135°, greater than about 150°, or about equal to 180° (i.e., antiparallel).

The inventive arrangement of the metal film results in less thickness variation among different metal film portions 291/292/293/296/297a, relative to conventional arrangements. In some inventive examples, the thickness of metal film portions 297a is between about 30% and about 300% of the thickness of adjacent portions 291 or 296 of the metal film, including thicknesses within that range greater than about 50%, greater than about 75%, about equal to 100%, greater than about 100%, greater than about 200%, less than about 50%, less than about 75%, less than about 100%, or less than about 200% of the thickness of adjacent portions 291 or 296 of the metal film. In some examples, the thickness of metal film portion 293 is between about 30% and about 300% the thickness of adjacent portions 291 or 292 of the metal film, including thicknesses within that range greater than about 50%, greater than about 75%, about equal to 100%, greater than about 100%, greater than about 200%, less than about 50%, less than about 75%, less than about 100%, or less than about 200% of the thickness of adjacent portions 291 or 292 of the metal film. Because electrical conductivity typically is limited by the thinnest portion of the metal film, the decreased thickness variation among the different metal film portions 291/292/293/296/297a enables a reduction in overall metal film thickness, because excessive metal need not be deposited on some areas to ensure adequate metal deposition on other areas.

For a given relative orientation of the transition surface 203 and the transition surface portions 207a, an optimal deposition direction 299 (i.e., deposition angle $\theta_{DEP} > 0°$) can be found that results in minimum variation, or at least acceptably small variation, among the thicknesses of the metal film portions 291/292/293/296/297a. In one example wherein the transition surface 203 is substantially vertical, the surface-normal vectors of the transition surface portions 207a are directed at 35.3° above the substrate top surface, and the horizontal projections of the surface-normal vectors of the transition surface portions 207a are substantially perpendicular to that of the transition surface 203, an acceptable deposition angle is $\theta_{DEP} \approx 45°$. Other deposition angles can be usefully employed with that relative arrangement of the transition surfaces; other deposition angles can be employed, and may be optimal, for other relative arrangements of the transition surfaces 203 and 207a. The deposition angle $\theta_{DEP}$ typically is between about 15° and about 75°, including angles within that range that are less than about 30°, about equal to 30°, greater than about 30°, less than about 45°, about equal to 45°, greater than about 45°, less than about 60°, about equal to 60°, or greater than about 60°.

In some examples, one or both of the non-recessed areal regions 202 or 206 can be arranged as a bond pad. Typically, a bond pad is an enlarged area of the metal film provide to enable an electrical connection to another electrical circuit or device, usually via a conductive wire attached to the bond pad or a component soldered to the bond pad. In the examples of FIGS. 9A-9G and 10A-10D, the metal film portion 296 on the non-recessed areal segment 206 is arranged as a bond pad. In some examples, the device substrate includes one or more active layers at a depth below a level of the recessed areal region 201, e.g., a quantum well or multi-quantum well layer.

The example of FIGS. 7A-7C (before masking and metal deposition) and FIGS. 8a-8C (after metal deposition and mask lift-off), much of the previous description applies. In addition, the device substrate includes another recessed region 204 separated from the recessed region 201 by the non-recessed region 202. The non-recessed region 202 is arranged as the top surface of a ridge protruding from the adjacent recessed regions 201/204. The ridge can act, e.g., to provide lateral optical confinement for optical modes supported by an optical waveguide defined by the ridge, in which case the semiconductor device is an optoelectronic device, such as a laser or optical modulator. The non-recessed areal region 202 is the top surface of the ridge optical waveguide, and electrical signals or currents are applied to the ridge optical waveguide via the metal film portions 292 or 293 (e.g., to inject current to drive a semiconductor laser, or to apply current or voltage to modulate transmission of an optical signal through the ridge waveguide, or for other suitable or desirable purpose). The transition surface 205 forms the second side surface of the ridge and joins the areal regions 202 and 204. In the example shown, transition surfaces 203 (joining regions 201 and 202) and 205 (joining regions 202 and 204) are arranged substantially vertically; in some examples, an inclined surface (i.e., with a surface-normal vector directed upward from the device substrate top surface) can join portions of adjacent areal regions 201 and 202, or adjacent areal regions 202 and 204. FIGS. 9A-9G are electron micrographs of an example of a semiconductor optoelectronic device with a metal film in an inventive arrangement similar to that of FIGS. 8A-8C.

In some examples, e.g., if substrate rocking or rotation is employed, metal film portions 292 and 294 can be contiguous, joined by metal deposited on the transition surface 205. In examples wherein neither substrate rocking nor rotation is employed and a directional metal deposition process is employed, the transition surface 205 and an adjacent portion 204a of the region 204 are shadowed by the non-recessed areal region 202 and lack any substantial deposited metal; at least a portion of the transition surface 205 is left exposed by the metal film. The metal film portion 294 is therefore non-contiguous with the metal film portion 292 (and therefore also non-contiguous with metal film portions 291/293/296/297a). That non-contiguity can have a beneficial side effect of reducing overall capacitance of any electrical pathway or circuitry that incorporates the metal film portions 291/292/293/296/297a. Reduced capacitance in turn can lead to faster device response time, which can be important for an optoelectronic device.

Another beneficial side effect of the exposure of the transition surface 205 (and the exposure of surface portion 204a in some examples) is an opportunity for non-destructive testing or diagnosis of the optoelectronic device that incorporates the ridge waveguide. If a conventional device arrangement is employed using substrate rocking or rotation during deposition, the entire waveguide is covered by the metal film, allowing no light to propagate out of the ridge waveguide. However, with one or both of the side surface 205 or surface portion 204a left exposed by the metal film in an inventive arrangement, light 213 can propagate transversely out of the ridge waveguide through one or both of the side surface 205 or the surface portion 204a during normal operation of the device (e.g., as in FIGS. 11A and 11B). The light 213 can arise, e.g., as scattering or electroluminescence within the waveguide, and can be detected, measured, or imaged, e.g., as a function of wavelength, position along the waveguide, electrical voltage or current level applied, optical signal power or wavelength applied, and so forth. Such detection, measurement, or imaging in turn can allow detailed characterization of the optoelectronic device during proper operation, or diagnosis of failure modes if the device fails to meet one or more predefined performance specifications (including failing to operate at all). Such inventive non-destructive testing, characterization, or failure analysis had not been available previously, and can be advantageously employed at various stages of fabrication, assembly, characterization, or testing of the optoelectronic device. An inventive method for testing or characterizing the optoelectronic device includes: (A) applying an electrical signal or current 212 to the metal film, or propagating an optical signal 211 along the ridge optical waveguide; and (B) detecting, measuring, or imaging light 213 propagating transversely out of the ridge optical waveguide through those portions of one or both of the second side surface 205 of the optical waveguide or the exposed portion 204a of the second recessed region 204 left exposed by the metal film.

The inventive methods described above for non-destructive testing or characterization of an optoelectronic device can be implemented generally, including for optoelectronic devices that are not necessarily arranged as described above. For any optoelectronic device that incorporates an optical waveguide (of any suitable type, e.g., ridge, buried heterostructure, and so forth), and requires application of an electrical signal via a metal film, the metal film can be arranged so as to leave exposed a portion of the device surface running parallel to the waveguide (e.g., as in FIGS. 11A and 11B; one or both exposed surfaces 204a and 205 in some examples that include a ridge waveguide; only exposed surface 204a in some examples that do not include a protruding ridge, such as a buried heterostructure laser). Light 213 emitted or scattered from one or more portions of the waveguide can propagate transversely out of the optical waveguide through the exposed portion of the device surface for detection, measurement, or imaging, as described above, thereby enabling non-destructive measurement, characterization, or failure analysis of the optoelectronic device. An inventive method for testing or characterizing the optoelectronic device includes: (A) applying an electrical signal or current 212 to the metal film, or propagating an optical signal 211 along the optical waveguide; and (B) detecting, measuring, or imaging light 213 propagating transversely out of the optical waveguide through those portions of the device surface left exposed by the metal film (e.g., one or both exposed surfaces 204a and 205 in the examples of FIGS. 11A and 11B).

Figure 10A:
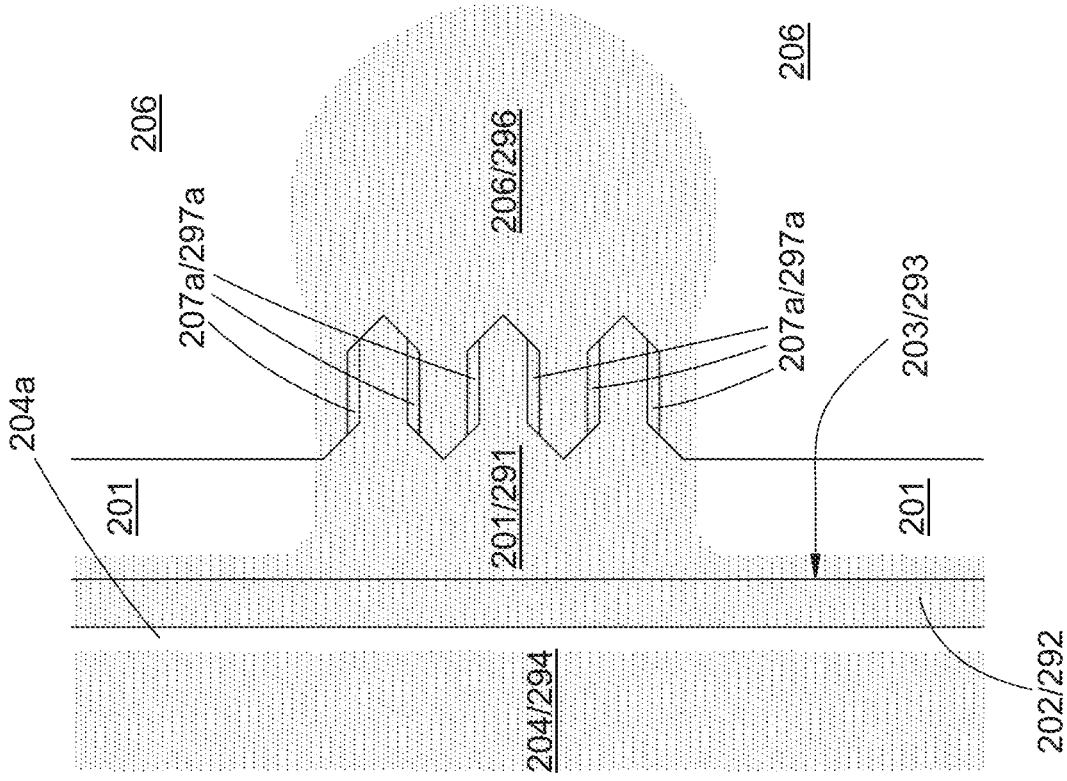
FIGS. 10A-10D illustrate schematically other examples of inventive arrangements of a metal film on a semiconductor device.
Figure 10B:
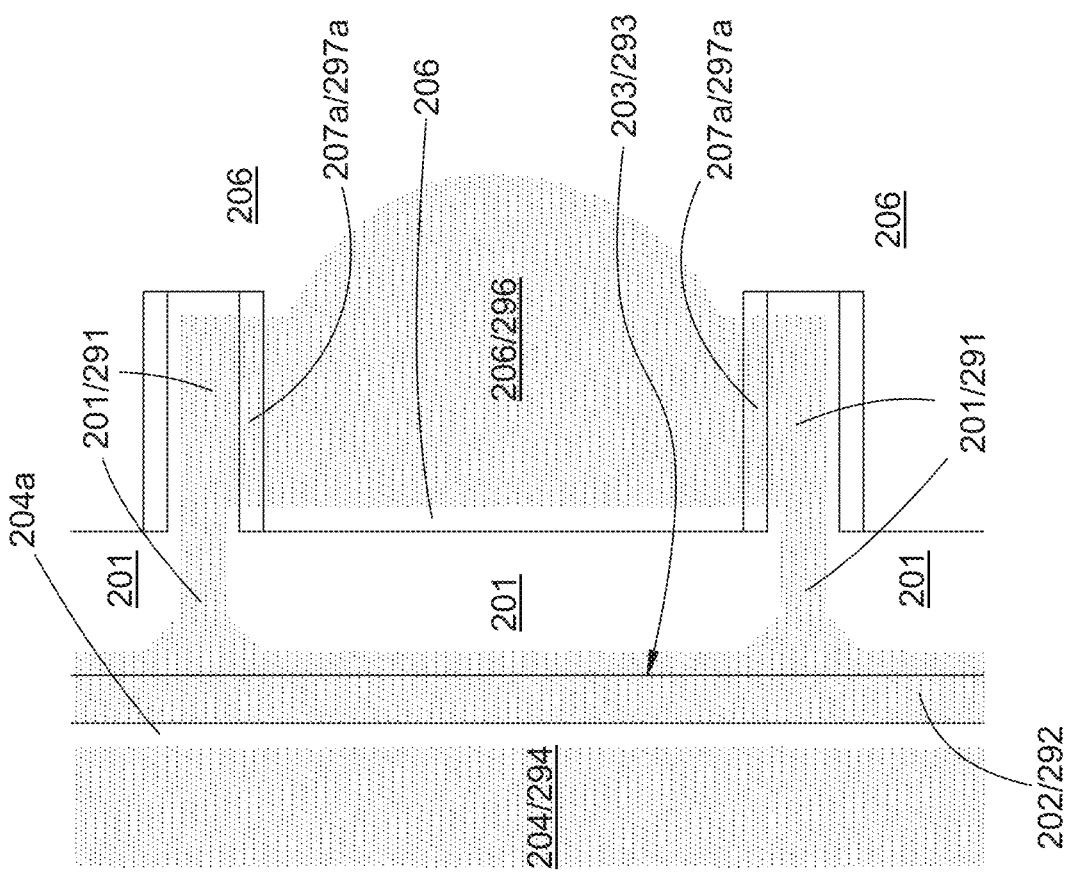
Figure 10C:
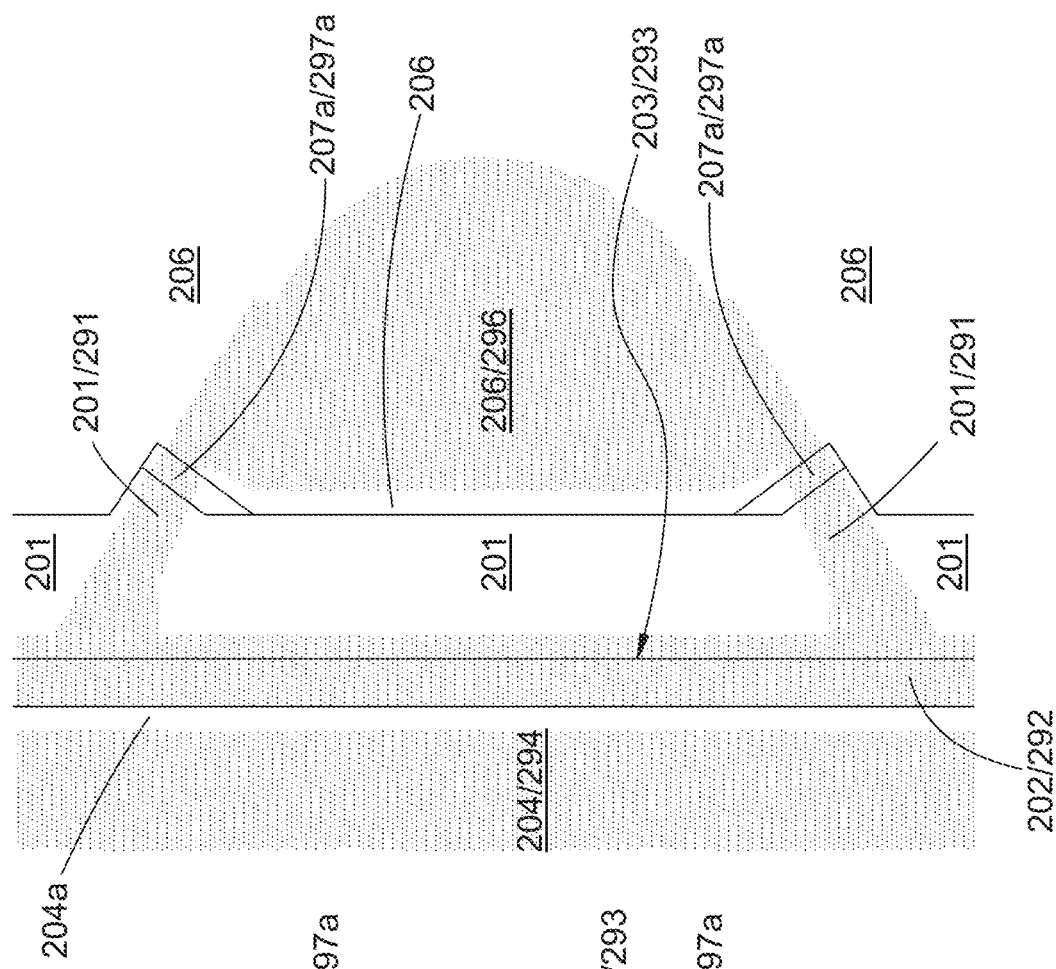
Figure 10D:
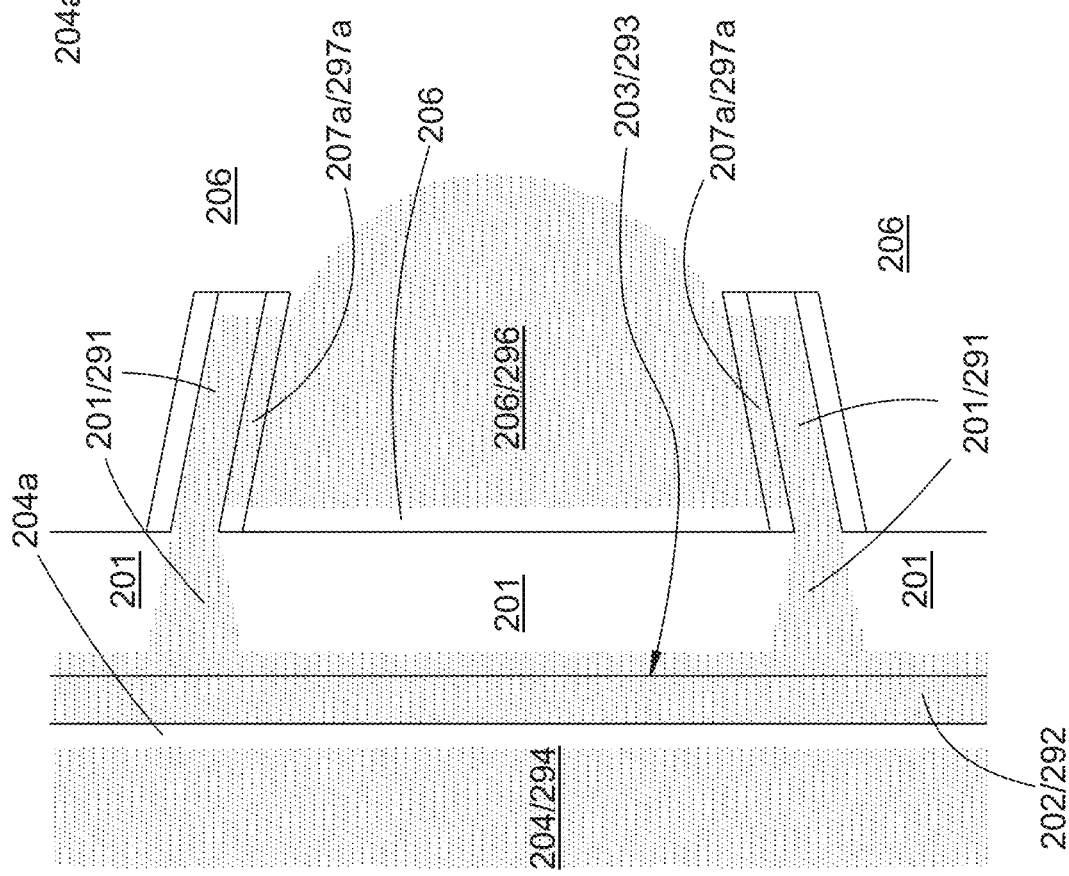

The examples of FIGS. 5A-5C, 6A-6C, 7A-7C, 8A-8C, and 9A-9G illustrate only one of many possible arrangements of the transition surface joining the areal regions 201 and 206, in which a pair of transition surface portions 207a are roughly perpendicular to the transition surface 203 and roughly parallel to the horizontal projection 299h of the deposition direction 299. The example of FIG. 10A includes two such structures; the example of FIG. 10B includes three such structures. In the example of FIG. 10C, the transition surface portions 207a are arranged so that horizontal projections of their surface-normal vector form angles less than 90° with respect to the horizontal projection of the surface-normal vector of transition surface 203. In the example of FIG. 10D, the transition surface portions 207a are arranged so that horizontal projections of their surface-normal vector form angles between 90° and 180° with respect to the horizontal projection of the surface-normal vector of transition surface 203. Each of those examples also includes transition surface portions that are roughly vertical and roughly parallel to the transition surface 203 (unlabeled to reduce clutter in the drawings). The various example arrangements of FIGS. 10A-10D represent only a few suitable arrangements; none of those arrangements are required. All that is required are one or more transition surface portions 207a arranged so that, at a suitable non-vertical deposition direction 299, they receive sufficient deposited metal along with the surfaces 201/202/203/206. That condition can be achieved with many different arrangements incorporating transition surface portions 207a/207b that roughly follow any suitable curvilinear path, e.g., a zigzag, sawtooth, serpentine, corrugated, or castellated path.

One property common to many inventive arrangements is flow of at least a portion of an electrical signal current, or propagation of at least a portion of an electrical signal voltage, along non-straight-line pathways through the metal film from one non-recessed areal region to another. In some examples, more than about 30% of the electrical signal flows or propagates along such nonlinear or tortuous pathways; in some examples, more than about 50% of the electrical signal flows of propagates along such nonlinear or tortuous pathways.

In addition to the preceding, the following examples fall within the scope of the present disclosure or appended claims:

Example 1. A semiconductor device comprising a device substrate and a metal film, wherein: (a) a device substrate top surface includes first and second non-recessed areal regions separated by a recessed areal region; (b) the metal film covers contiguously at least a portion of the first non-recessed areal region, at least a portion of the recessed areal region, at least a portion of the second non-recessed areal region, at least a portion of a first transition surface joining the recessed and first non-recessed areal regions, and at least a portion of a second transition surface joining the recessed and second non-recessed areal regions; and (c) the first transition surface includes one or more metallized portions over which (i) corresponding horizontal projections of surface-normal vectors of the first and second transition surfaces are not antiparallel, (ii) the surface-normal vector of the first transition surface is not parallel to the device substrate and is directed at a non-zero angle above the substrate top surface, and (iii) a corresponding portion of the metal film covers the first transition surface and is contiguous with adjacent portions of the metal film on the recessed and first non-recessed areal regions.

Example 2. The device of Example 1 wherein the second transition surface is substantially flat, substantially perpendicular to the device substrate, and characterized by a single surface-normal vector direction that is substantially parallel to the device substrate.

Example 3. The device of Example 2 wherein the first transition surface includes one or more portions, distinct from the metallized portions of part (c), for which the corresponding horizontal projections of surface-normal vectors of the first and second transition surfaces are substantially antiparallel.

Example 4. The device of any one of Examples 2 or 3 wherein the first transition surface includes one or more portions, distinct from the metallized portions of part (c), for which the corresponding surface-normal vectors of the first and second transition surfaces are substantially antiparallel.

Example 5. The device of any one of Examples 2 through 4 wherein the first transition surface includes one or more portions, distinct from the metallized portions of part (c), for which the corresponding horizontal projections of surface-normal vectors of the first and second transition surfaces are substantially antiparallel and which lack any portion of the metal film.

Example 6. The device of any one of Examples 1 through 5 wherein the device substrate comprises a Group IV semiconductor or a III-V semiconductor, and the second transition surface is substantially parallel to a {001} crystallographic surface of the device substrate.

Example 7. The device of any one of Examples 1 through 6 wherein, over the metallized portions of part (c), thickness of the metal film over the first transition surface is between about 30% and about 300% of thickness of the metal film over adjacent contiguous portions of the recessed and first non-recessed areal regions.

Example 8. The device of Example 7 wherein, over the metallized portions of part (c), thickness of the metal film over the first transition surface is greater than about 50%, greater than about 75%, about equal to 100%, greater than about 100%, greater than about 200%, less than about 50%, less than about 75%, less than about 100%, or less than about 200% of thickness of the metal film over adjacent contiguous portions of the recessed and first non-recessed areal regions.

Example 9. The device of any one of Examples 1 through 8 wherein, over at least portions of the second transition surface, thickness of the metal film over the second transition surface is between about 30% and about 300% of thickness of the metal film over adjacent contiguous portions of the recessed and second non-recessed areal regions.

Example 10. The device of Example 9 wherein, over at least portions of the second transition surface, thickness of the metal film over the second transition surface is greater than about 50%, greater than about 75%, about equal to 100%, greater than about 100%, greater than about 200%, less than about 50%, less than about 75%, less than about 100%, or less than about 200% of thickness of the metal film over adjacent contiguous portions of the recessed and second non-recessed areal regions.

Example 11. The device of any one of Examples 1 through 10 wherein, over at least the metallized portions of part (c), the surface-normal vector of the first transition surface is directed at an angle above the substrate top surface that is between about 15° and about 75°.

Example 12. The device of Example 11 wherein, over at least the metallized portions of part (c), the surface-normal vector of the first transition surface is directed at an angle above the substrate top surface that is greater than about 20°, greater than about 30°, greater than about 45°, greater than about 60°, greater than about 70°, about equal to 35.3°, less than about 20°, less than about 30°, less than about 45°, less than about 60°, or less than about 70°.

Example 13. The device of any one of Examples 1 through 10 wherein, over at least the metallized portions of part (c), the device substrate comprises a Group IV semiconductor or a III-V semiconductor, and, over at least the metallized portions of part (c), the first transition surface is substantially parallel to a {111} crystallographic surface of the device substrate.

Example 14. The device of any one of Examples 1 through 13 wherein, over at least the metallized portions of part (c), the corresponding horizontal projections of the surface-normal vectors of the first and second transition surfaces form an angle between about 10° and about 170°.

Example 15. The device of Example 14 wherein, over at least the metallized portions of part (c), the corresponding horizontal projections of the surface-normal vectors of the first and second transition surfaces form an angle less than about 150°, less than about 135°, less than about 120°, less than about 90°, about equal to 90°, less than about 60°, less than about 45°, less than about 30°, greater than about 150°, greater than about 135°, greater than about 120°, greater than about 90°, greater than about 60°, greater than about 45°, or greater than about 30°.

Example 16. The device of any one of Examples 1 through 15 wherein, over at least the metallized portions of part (c), the corresponding horizontal projections of the surface-normal vectors of the first and second transition surfaces are substantially perpendicular.

Example 17. The device of any one of Examples 1 through 16 wherein at least a portion of the metal film is arranged on one of the first or second non-recessed areal regions as a bond pad.

Example 18. The device of any one of Examples 1 through 17 wherein more than about 30% of an electrical signal flows or propagates between the first and second non-recessed regions along one or more nonlinear or tortuous non-straight-line pathways along the metal film.

Example 19. The device of any one of Examples 1 through 18 wherein the device substrate includes one or more active layers at a depth below a level of the recessed areal region.

Example 20. The device of any one of Examples 1 through 19 wherein: (d) the semiconductor device is an optoelectronic device; (e) the second non-recessed areal region is a top surface of a ridge optical waveguide that protrudes above the first recessed areal region and separates the recessed areal region from a second recessed areal region; (f) a first side surface of the ridge optical waveguide forms the second transition surface; and (g) a second side surface of the ridge optical waveguide forms a third transition surface, and the third transition surface joins the second non-recessed areal region and the second recessed areal region.

Example 21. The device of Example 20 wherein the metal film is arranged so as to apply an electrical signal to the ridge optical waveguide by propagation of that signal between metallized portions of the first and second non-recessed areal regions via metallized portions of the first transition surface, the recessed areal region, and the second transition surface.

Example 22. The device of any one of Examples 20 or 21 wherein the metal film is non-contiguous with any metal deposited on the second recessed areal region.

Example 23. The device of any one of Examples 20 through 22 wherein the metal film is arranged so as to leave exposed at least a portion of the second side surface of the ridge optical waveguide or an adjacent portion of the second recessed areal region.

Example 24. The device of Example 23 wherein the ridge optical waveguide and the metal film are arranged so that light emanating from within the ridge optical waveguide can propagate transversely out of the ridge optical waveguide through those portions of the second side surface of the optical waveguide or the second recessed areal region left exposed by the metal film.

Example 25. A method for using the device of any one of Examples 23 or 24, the method comprising: (A) applying an electrical signal or current to the metal film, or propagating an optical signal along the ridge optical waveguide; and (B) detecting, measuring, or imaging light propagating transversely out of the ridge optical waveguide through those portions of the second side surface of the optical waveguide or the second recessed areal region left exposed by the metal film.

Example 26. The method of Example 25 further comprising spectrally or spatially resolving the light detected, measured, or imaged in part (B).

Example 27. The method of any one of Examples 25 or 26 further comprising resolving the light detected, measured, or imaged in part (B) as a function of applied electrical signal or current or propagating optical signal level.

Example 28. The method of any one of Examples 25 through 27 further comprising, after part (A) but before part (B), observing a failure of the optoelectronic device to meet a predefined performance specification.

Example 29. A method for making the device of any one of Examples 1 through 24, the method comprising: (A) using one or more spatially selective material processing steps, forming a lift-off mask on the substrate top surface; (B) using a non-vertical deposition direction, depositing metal on masked and unmasked portions of the substrate top surface; and (C) removing the lift-off mask and the metal deposited on the masked portions of the substrate top surface, leaving behind metal deposited on unmasked portions of the substrate top surface as the metal film, (D) wherein corresponding horizontal projections of the surface-normal vector of the second transition surface and the deposition direction form an angle greater than about 90°.

Example 30. The method of Example 29 further comprising, before part (A), using one or more spatially selective material processing steps to form one or more of the first and second non-recessed areal regions, the recessed areal region, of the first or second transition surfaces.

Example 31. The method of any one of Examples 29 or 30 wherein corresponding horizontal projections of the surface-normal vector of the second transition surface and the deposition direction form an angle greater than about 90°, greater than about 120°, greater than about 135°, or greater than about 150°.

Example 32. The method of any one of Examples 29 or 30 wherein corresponding horizontal projections of the surface-normal vector of the second transition surface and the deposition direction are substantially antiparallel.

Example 33. The method of any one of Examples 29 through 32 wherein the deposition direction is between about 15° and about 75° away from vertical.

Example 34. The method of Example 33 wherein the deposition direction is less than about 30°, about equal to 30°, greater than about 30°, less than about 45°, about equal to 45°, greater than about 45°, less than about 60°, about equal to 60°, or greater than about 60° away from vertical.

Example 35. A semiconductor device comprising a device substrate, an optical waveguide formed on or in the device substrate, and a metal film formed over at least a portion of a device surface and over the optical waveguide, wherein: (a) the metal film is arranged so as to apply an electrical signal to the optical waveguide; and (b) the metal film is arranged so as to leave exposed at least a portion of the device surface running substantially parallel to the optical waveguide so that light emanating from within the optical waveguide can propagate transversely out of the optical waveguide through portions of the device surface left exposed by the metal film.

Example 36. A method for using the device of Example 35, the method comprising: (A) applying an electrical signal or current to the metal film, or propagating an optical signal along the optical waveguide; and (B) detecting, measuring, or imaging light propagating transversely out of the optical waveguide through portions of the device surface left exposed by the metal film.

Example 37. The method of Example 36 further comprising spectrally or spatially resolving the light detected, measured, or imaged in part (B).

Example 38. The method of any one of Examples 36 or 37 further comprising resolving the light detected, measured, or imaged in part (B) as a function of applied electrical signal or current or propagating optical signal level.

Example 39. The method of any one of Examples 36 through 38 further comprising, after part (A) but before part (B), observing a failure of the optoelectronic device to meet a predefined performance specification.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

In the appended claims, any labelling of elements, steps, limitations, or other portions of a claim (e.g., first, second, etc., (a), (b), (c), etc., or (i), (ii), (iii), etc.) is only for purposes of clarity, and shall not be construed as implying any sort of ordering or precedence of the claim portions so labelled. If any such ordering or precedence is intended, it will be explicitly recited in the claim or, in some instances, it will be implicit or inherent based on the specific content of the claim. In the appended claims, if the provisions of 35

USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor device comprising a device substrate and a metal film, wherein:
    (a) a device substrate top surface includes first and second non-recessed areal regions separated by a recessed areal region;
    (b) the metal film covers contiguously at least a portion of the first non-recessed areal region, at least a portion of the recessed areal region, at least a portion of the second non-recessed areal region, at least a portion of a first transition surface joining the recessed and first non-recessed areal regions, and at least a portion of a second transition surface joining the recessed and second non-recessed areal regions; and
    (c) the first transition surface includes one or more metallized portions over which (i) corresponding horizontal projections of surface-normal vectors of the first and second transition surfaces are not antiparallel, (ii) the surface-normal vector of the first transition surface is not parallel to the device substrate and is directed at a non-zero angle above the substrate top surface, and (iii) a corresponding portion of the metal film covers the first transition surface and is contiguous with adjacent portions of the metal film on the recessed and first non-recessed areal regions.

2. The device of claim 1 wherein the second transition surface is substantially flat, substantially perpendicular to the device substrate, and characterized by a single surface-normal vector direction that is substantially parallel to the device substrate.

3. The device of claim 2 wherein the first transition surface includes one or more portions, distinct from the metallized portions of part (c), for which the corresponding horizontal projections of surface-normal vectors of the first and second transition surfaces are substantially antiparallel.

4. The device of claim 2 wherein the first transition surface includes one or more portions, distinct from the metallized portions of part (c), for which the corresponding surface-normal vectors of the first and second transition surfaces are substantially antiparallel.

5. The device of claim 2 wherein the first transition surface includes one or more portions, distinct from the metallized portions of part (c), for which the corresponding horizontal projections of surface-normal vectors of the first and second transition surfaces are substantially antiparallel and which lack any portion of the metal film.

6. The device of claim 2 wherein the device substrate comprises a Group IV semiconductor or a III-V semiconductor, and the second transition surface is substantially parallel to a {001} crystallographic surface of the device substrate.

7. The device of claim 1 wherein, over the metallized portions of part (c), thickness of the metal film over the first transition surface is between about 30% and about 300% of thickness of the metal film over adjacent contiguous portions of the recessed and first non-recessed areal regions.

8. The device of claim 1 wherein, over at least portions of the second transition surface, thickness of the metal film over the second transition surface is between about 30% and about 300% of thickness of the metal film over adjacent contiguous portions of the recessed and second non-recessed areal regions.

9. The device of claim 1 wherein, over at least the metallized portions of part (c), the surface-normal vector of the first transition surface is directed at an angle above the substrate top surface that is between about 15° and about 75°.

10. The device of claim 1 wherein, over at least the metallized portions of part (c), the corresponding horizontal projections of the surface-normal vectors of the first and second transition surfaces form an angle between about 10° and about 170°.

11. The device of claim 1 wherein, over at least the metallized portions of part (c), the corresponding horizontal projections of the surface-normal vectors of the first and second transition surfaces are substantially perpendicular.

12. The device of claim 1 wherein, wherein (i) the device substrate comprises a Group IV semiconductor or a III-V semiconductor, and (ii) over at least the metallized portions of part (c), the first transition surface is substantially parallel to a {111} crystallographic surface of the device substrate.

13. The device of claim 1 wherein at least a portion of the metal film is arranged on one of the first or second non-recessed areal regions as a bond pad.

14. The device of claim 1 wherein more than about 30% of an electrical signal flows or propagates between the first and second non-recessed regions along one or more nonlinear or tortuous non-straight-line pathways along the metal film.

15. The device of claim 1 wherein the device substrate includes one or more active layers at a depth below a level of the recessed areal region.

16. The device of claim 1 wherein:
    (d) the semiconductor device is an optoelectronic device;
    (e) the second non-recessed areal region is a top surface of a ridge optical waveguide that protrudes above the recessed areal region and separates the recessed areal region from a second recessed areal region;
    (f) a first side surface of the ridge optical waveguide forms the second transition surface; and
    (g) a second side surface of the ridge optical waveguide forms a third transition surface, and the third transition surface joins the second non-recessed areal region and the second recessed areal region.

17. The device of claim 16 wherein the metal film is arranged so as to apply an electrical signal to the ridge optical waveguide by propagation of that signal between metallized portions of the first and second non-recessed areal regions via metallized portions of the first transition surface, the recessed areal region, and the second transition surface.

18. The device of claim 16 wherein the metal film is non-contiguous with any metal deposited on the second recessed areal region.

19. The device of claim 16 wherein the metal film is arranged so as to leave exposed at least a portion of the second side surface of the ridge optical waveguide or an adjacent portion of the second recessed areal region.

20. The device of claim 19 wherein the ridge optical waveguide and the metal film are arranged so as to enable transverse propagation of light emanating from within the ridge optical waveguide out of the ridge optical waveguide through those portions of the second side surface of the optical waveguide or the second recessed areal region left exposed by the metal film.

21. A method for using the device of claim 20, the method comprising:
    (A) applying an electrical signal or current to the metal film, or propagating an optical signal along the ridge optical waveguide; and
    (B) detecting, measuring, or imaging light propagating transversely out of the ridge optical waveguide through those portions of the second side surface of the optical waveguide or the second recessed areal region left exposed by the metal film.

22. The method of claim 21 further comprising spectrally or spatially resolving the light detected, measured, or imaged in part (B).

23. The method of claim 21 further comprising resolving the light detected, measured, or imaged in part (B) as a function of applied electrical signal or current or propagating optical signal level.

24. The method of claim 21 further comprising, after part (A) but before part (B), observing a failure of the optoelectronic device to meet a predefined performance specification.

25. A method for making the device of claim 1, the method comprising:
    (A) using one or more spatially selective material processing steps, forming a lift-off mask on the substrate top surface;
    (B) using a non-vertical deposition direction, depositing metal on masked and unmasked portions of the substrate top surface; and
    (C) removing the lift-off mask and the metal deposited on the masked portions of the substrate top surface, leaving behind metal deposited on unmasked portions of the substrate top surface as the metal film,
    (D) wherein corresponding horizontal projections of the surface-normal vector of the second transition surface and the deposition direction form an angle greater than about 90°.

26. The method of claim 25 further comprising, before part (A), using one or more spatially selective material processing steps to form one or more of the first or second non-recessed areal regions, the recessed areal region, or the first or second transition surfaces.

27. The method of claim 25 wherein corresponding horizontal projections of the surface-normal vector of the second transition surface and the deposition direction are substantially antiparallel.

28. The method of claim 25 wherein the deposition direction is between about 15° and about 75° away from vertical.

* * * * *